(12) United States Patent
Chin et al.

(10) Patent No.: US 8,762,806 B2
(45) Date of Patent: Jun. 24, 2014

(54) DECODING CIRCUIT AND ENCODING CIRCUIT

(75) Inventors: Po Shin Francois Chin, Singapore (SG); Zhao Hui Cai, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 368 days.

(21) Appl. No.: 13/120,878

(22) PCT Filed: Sep. 15, 2009

(86) PCT No.: PCT/SG2009/000342
§ 371 (c)(1),
(2), (4) Date: Jul. 15, 2011

(87) PCT Pub. No.: WO2010/036209
PCT Pub. Date: Apr. 1, 2010

(65) Prior Publication Data
US 2011/0264986 A1    Oct. 27, 2011

Related U.S. Application Data

(60) Provisional application No. 61/100,280, filed on Sep. 26, 2008, provisional application No. 61/105,500, filed on Oct. 15, 2008.

(51) Int. Cl.
*H03M 13/00* (2006.01)
*H04L 1/18* (2006.01)
*G11C 29/00* (2006.01)

(52) U.S. Cl.
USPC .......................... 714/751; 714/752; 714/763

(58) Field of Classification Search
None
See application file for complete search history.

(56) References Cited

U.S. PATENT DOCUMENTS

| | | | |
|---|---|---|---|
| 7,072,417 B1 | 7/2006 | Burd et al. | |
| 8,407,567 B2 * | 3/2013 | Gunnam | 714/780 |
| 2004/0153938 A1 | 8/2004 | Okamura et al. | |
| 2004/0194007 A1 | 9/2004 | Hocevar | |
| 2005/0204271 A1 | 9/2005 | Sharon et al. | |
| 2005/0246606 A1 | 11/2005 | Cameron et al. | |
| 2007/0157061 A1 * | 7/2007 | Lee et al. | 714/752 |
| 2010/0042902 A1 * | 2/2010 | Gunnam | 714/780 |
| 2010/0042903 A1 * | 2/2010 | Gunnam | 714/780 |

FOREIGN PATENT DOCUMENTS

| | | |
|---|---|---|
| CN | 1697329 | 11/2005 |
| CN | 101242188 | 8/2008 |
| JP | 2004343170 | 12/2004 |
| JP | 2007328894 | 12/2007 |
| WO | WO 2006/062351 A1 | 6/2006 |

* cited by examiner

*Primary Examiner* — Guerrier Merant
(74) *Attorney, Agent, or Firm* — K. David Crockett, Esq.; Niky Economy Syrengelas, Esq.; Crockett & Crockett, Esq.

(57) ABSTRACT

A decoding circuit including a data buffer comprises a plurality of storage elements for storing data symbols, a processing circuit comprising a plurality of inputs and outputs, wherein the processing circuitry is configured to process data symbols received via the plurality of inputs and outputs. First and second decoding parameters are determined by a decoding rule and wherein the first and the second decoding parameters are not changed throughout the decoding process.

18 Claims, 26 Drawing Sheets

FIG 4

The first 4 VN banks (initialized with channel LLRs)

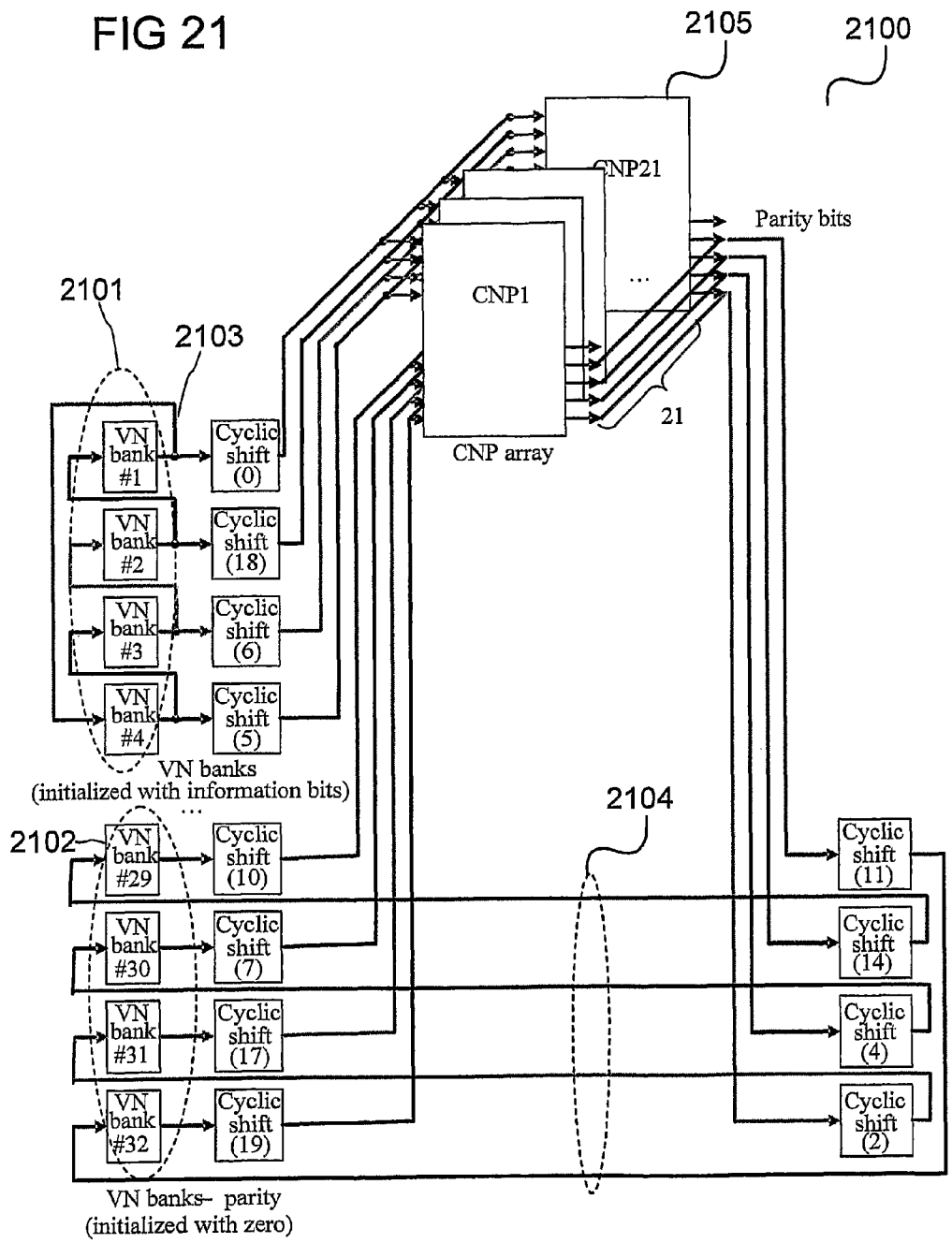

FIG 23

DECODING CIRCUIT AND ENCODING CIRCUIT

Embodiments of the invention generally relate to a decoding circuit and an encoding circuit.

Low-density parity-check (LDPC) codes are a class of linear block codes. "Low-density" refers to the characteristic that a LDPC parity-check matrix comprises only a few 1's in comparison to the amount of 0's. LDPC codes provide a performance which is very close to the channel capacity for a lot of different channels and allow linear time complex algorithms for decoding. Furthermore, LDPC codes are suited for implementations that make heavy use of parallelism.

A LDPC code is defined by its parity check matrix H. For any parity check matrix H a corresponding bipartite graph exists, called the Tanner graph, which comprises a set of variable nodes (V) and a set of check nodes (C). A check node C (with index i) is connected to a variable node V (with index j) in the Tanner graph if the element $h_{ij}$ of the parity check matrix H is 1.

In decoding in the context of a data transmission, the number of columns N of the parity check matrix H corresponds to the number of codeword bits of a codeword transmitted via a communication channel. The codeword transmitted via the communication channel comprises a number K of information bits and a number M of parity check bits. The number of rows of the parity check matrix H corresponds to the number of parity check bits M. The corresponding Tanner graph comprises M=N−K check nodes C (wherein each check node corresponds to a check equation given by one row of the matrix H) and N variable nodes, one for each bit of the received codeword. Conventional LDPC decoders are illustrated in FIGS. 1 and 2.

FIG. 1 shows an LDPC decoder 100.

The LDPC decoder 100 comprises a block row sequence controller 101, a storage memory 102, parity check update blocks 103, a parity check function block 104, router circuitry 105, bit update blocks 106 and reverse router circuitry 107.

For example, a ROM (read only memory) is used to store the tanner graph, e.g. as part of the block row sequence controller 101. Typically, a complicated control logic or state machine is required for the control according to the Tanner graph.

Furthermore, the routing/reverse routing networks, which connect variable node and check node processors, typically includes a large amount of bank of multiplexers.

FIG. 2 shows an LDPC decoder 200.

The LDPC decoder 200 includes a ROM graph memory 201 for storing the tanner graph. The LDPC decoder 200 further includes a first RAM (random access memory) 202 for storing the data to be sent to the check nodes (initialized with the a-priori estimates or log-likelihood radios), a switch 203, a check node processor block 204, a second RAM 205 for storing the check node processor output (Rcv) messages and a parity check function block 206.

Also for this LDPC decoder, the switch 203 typically comprises a large amount of bank of multiplexers.

An object on which embodiments may be seen to be based is to provide an (LDPC) encoder and an (LDPC) decoder that are more efficient and/or less complex than known LDPC encoders and decoders.

This object is solved by the decoding circuit and the encoding circuit with the features according to the independent claims.

In one embodiment, a decoding circuit is provided comprising a data buffer, comprising a plurality of storage elements for storing data symbols and a processing circuit comprising a plurality of inputs and a plurality of outputs. The processing circuit is configured to process data symbols received via the plurality of inputs and output the processed data symbols via the plurality of outputs. Each storage element of the plurality of storage elements is coupled to an associated input of the plurality of inputs, wherein the association of the plurality of storage elements with the plurality of inputs is determined by a first decoding parameter. Each storage element of the plurality of storage elements is coupled to an associated output of the plurality of outputs, wherein the association of the plurality of storage elements with the plurality of outputs is determined by a second decoding parameter. The first decoding parameter and the second decoding parameter are determined by a decoding rule and the first decoding parameter and the second decoding parameter are not changed throughout the decoding process.

In another embodiment, an encoding circuit is provided comprising a data buffer, comprising a plurality of storage elements for storing data symbols and a processing circuit comprising a plurality of inputs and a plurality of outputs. The processing circuit is configured to process data symbols received via the plurality of inputs and output the processed data symbols via the plurality of outputs. Each storage element of the plurality of storage elements is coupled to an associated input of the plurality of inputs, wherein the association of the plurality of storage elements with the plurality of inputs is determined by a first encoding parameter. Each storage element of the plurality of storage elements is coupled to an associated output of the plurality of outputs, wherein the association of the plurality of storage elements with the plurality of outputs is determined by a second encoding parameter wherein the first encoding parameter and the second encoding parameter are determined by a encoding rule wherein the first encoding parameter and the second encoding parameter are not changed throughout the encoding process.

Illustrative embodiments of the invention are explained below with reference to the drawings. Embodiments which are described in context of the decoding circuit are analogously valid for the encoding circuit.

FIG. 4 shows a first parity check matrix, a second parity check matrix, and a third parity check matrix.

FIG. 21 shows an encoder according to an embodiment.

FIG. 23 shows parity check matrices according to an embodiment.

DETAILED DESCRIPTION

Embodiments described below in context of the encoding circuit are analogously valid for the decoding circuit and vice versa.

Figure 3:
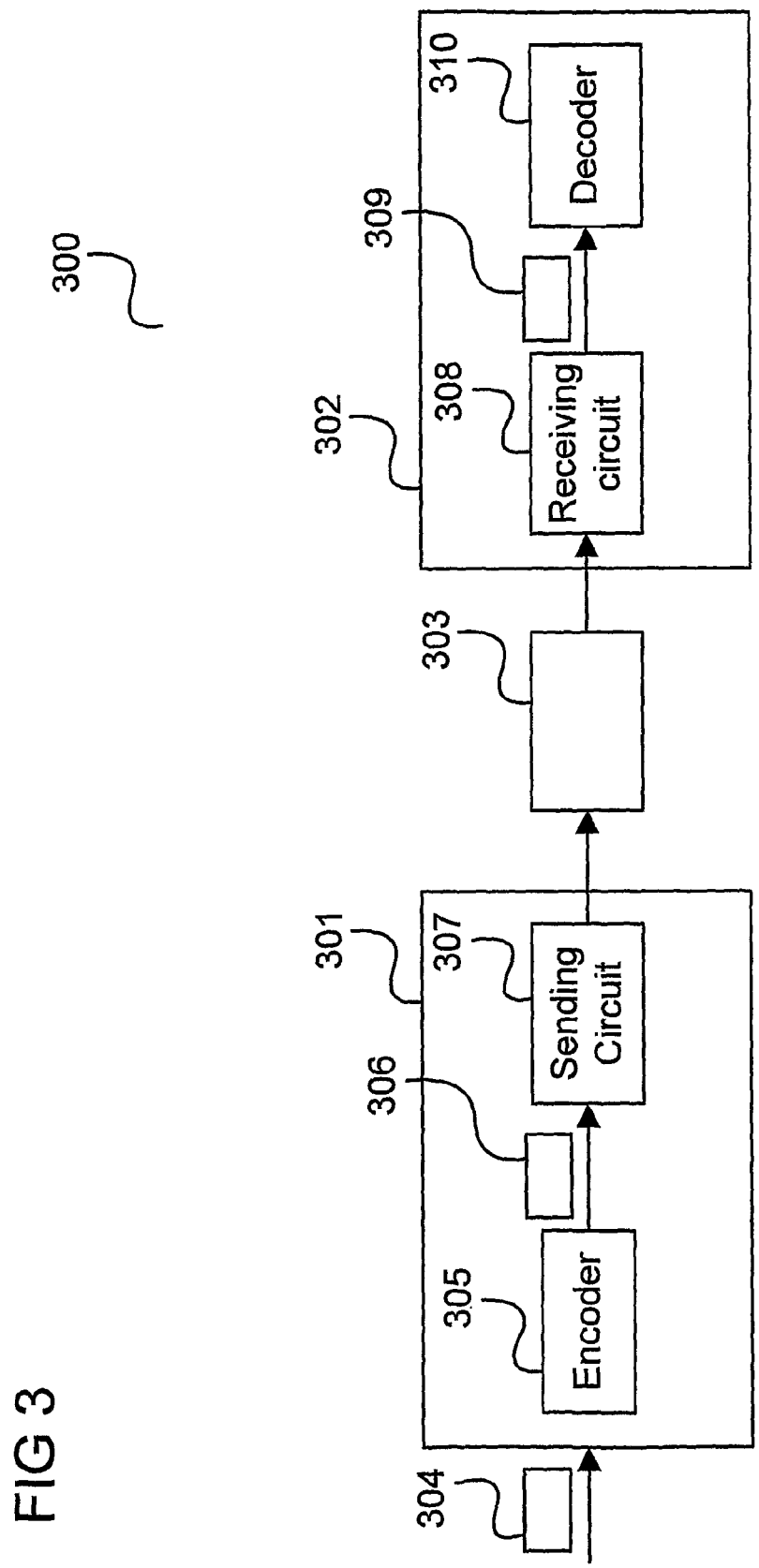
FIG. 3 shows a communication system according to an embodiment.

LDPC (low density parity check) code may for example be used for data transmission from a sending device to a receiving device as it is illustrated in FIG. 3.

FIG. 3 shows a communication system 300 according to an embodiment.

The communication system 300 comprises a transmitter 301 that transmits data to be transmitted 304 to a receiver 302 via a communication channel 303.

The data to be transmitted 304 is encoded by an encoder 305 to a plurality of code words. The encoder 305 supplies the encoded data 306 to a sending circuit 307 (for example comprising a modulator, a transmit antenna, etc.) that sends the encoded data 306 to the receiver 302 via the communication channel 303.

The encoded data 306 is received as received data 309 by a receiving circuit 308 (for example comprising a demodulator, a receive antenna, etc.). Since the code words are affected by noise of the communication channel 303 in transmission, the receiving circuit 308 does not reconstruct code words exactly but generates log-likelihood ratios (LLR) 309 for the received codeword bits. These are supplied to a decoder 310 that reconstructs the transmitted code words.

The encoder 305 and the decoder 310 are for example configured according to an error correction code, for example according to LDPC.

A LDPC code is defined by its parity check matrix H. For any parity check matrix H a corresponding bipartite graph exists, called the Tanner graph, which comprises a set of variable nodes (V) and a set of check nodes (C). A check node C (with index i) is connected to a variable node V (with index j) in the Tanner graph if the element $h_{ij}$ of the parity check matrix H is 1.

The number of columns N of the parity check matrix H corresponds to the number of codeword bits of a transmitted codeword. Each codeword comprises a number K of information bits and a number M of parity check bits. The number of rows of the parity check matrix H corresponds to the number of parity check bits M. The corresponding Tanner graph comprises M=N−K check nodes C (wherein each check node corresponds to a check equation given by one row of the matrix H) and N variable nodes, one for each bit of the received codeword.

In a block-based LDPC code the parity-check matrices can be partitioned into square sub blocks (sub matrices) of size Z×Z. A sub matrix is either a cyclic-permutation $P_i$ of the identity matrix $I_Z$ or a null sub matrix.

A cyclic-permutation matrix $P_i$ is obtained from the Z×Z identity matrix by cyclically shifting the columns of the identity matrix to the right by i elements. The matrix $P_0$ is the Z×Z identity matrix.

For example, for Z=8

$$P_0 = \begin{bmatrix} 1 & 0 & \ldots & \ldots & 0 \\ 0 & 1 & 0 & \ldots & 0 \\ \ldots & 0 & \ldots & 0 & \ldots \\ 0 & \ldots & 0 & 1 & 0 \\ 0 & \ldots & \ldots & 0 & 1 \end{bmatrix},$$

$$P_1 = \begin{bmatrix} 0 & 1 & \ldots & \ldots & 0 \\ \ldots & 0 & 1 & 0 & \ldots \\ \ldots & \ldots & \ldots & 1 & 0 \\ 0 & \ldots & \ldots & 0 & 1 \\ 1 & 0 & \ldots & 0 & 0 \end{bmatrix},$$

$$P_2 = \begin{bmatrix} 0 & 0 & 1 & \ldots & 0 \\ 0 & 0 & 0 & 1 & \ldots \\ 0 & \ldots & \ldots & \ldots & \ldots \\ 1 & 0 & \ldots & 0 & 1 \\ 0 & 1 & 0 & \ldots & 0 \end{bmatrix}$$

The matrices $P_1$ and $P_2$ are produced by cyclically shifting the columns of the identity matrix $I_z = P_0$ to the right by 1 and 2 places, respectively.

This structure allows processing of at least Z messages in a parallel fashion.

Figure 4:
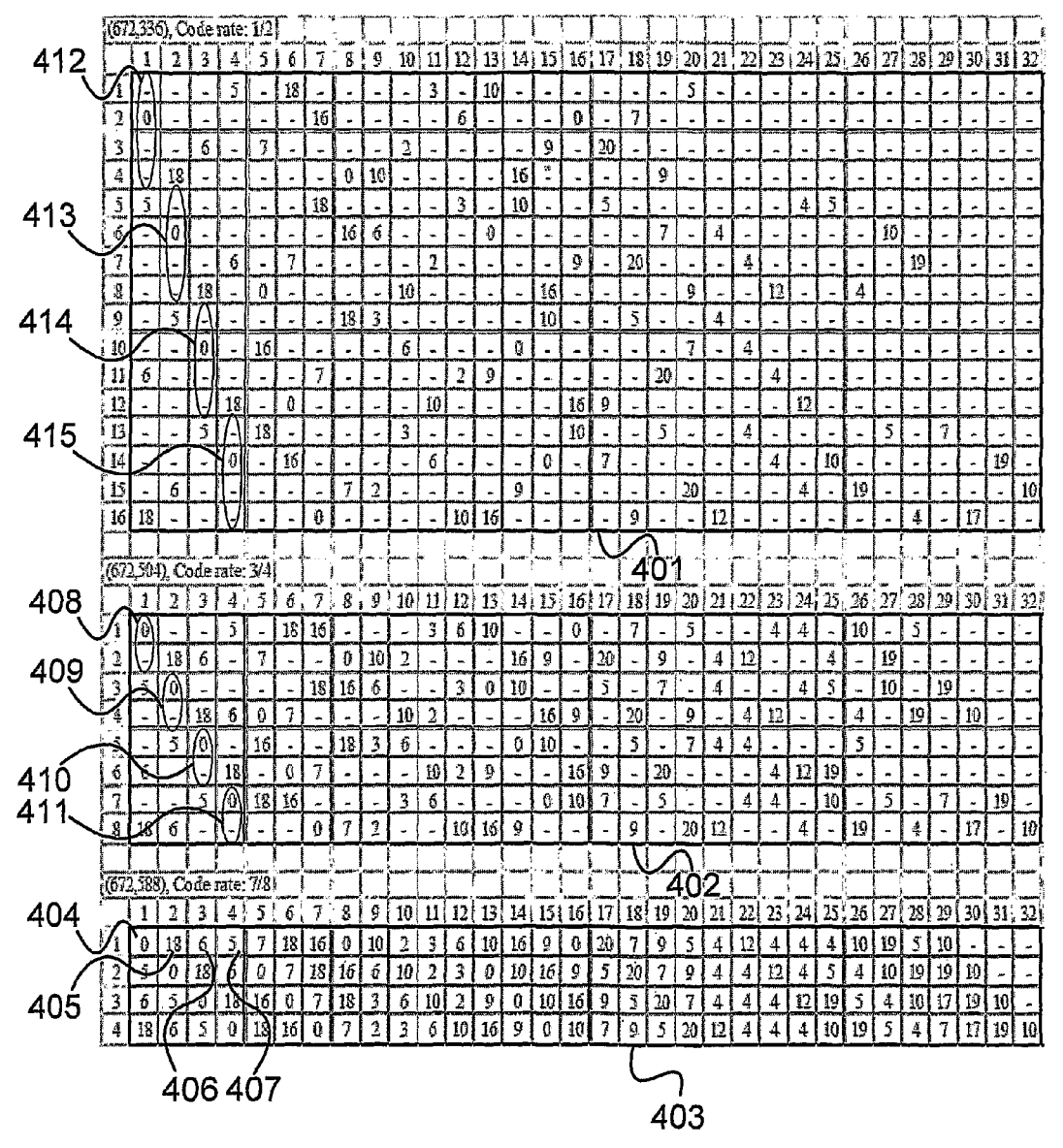

Examples for block-LDPC code parity check matrices H are shown in the FIG. 4.

FIG. 4 shows a first parity check matrix 401, a second parity check matrix 402, and a third parity check matrix 403.

Each parity check matrix includes 32 block columns (numbered 1 to 32). The first parity check matrix 401 includes 16 block rows (labelled 1 to 16), the second parity check matrix 402 includes 8 block rows (labelled 1 to 8), and the third parity check matrix 403 includes 4 block rows (labelled 1 to 4).

In this examples, Z=21, and the codeword length is 672 (32 block columns times 21 sub block columns per block column), i.e. the corresponding codes are length 672 LDPC codes. The codes corresponding to the parity check matrices 401, 402, 403 were proposed for the emerging IEEE 802.15.3c high rate Wireless Personal Access Networks (WPANs) standard.

As one can see from the third parity check matrix 403, the elements of the matrix are highly regular: Each block row is a cyclic shift (of length 4) of its above block row. Embodiments described in the following can be seen to be based on this type of highly structured LDPC codes.

Figure 5:
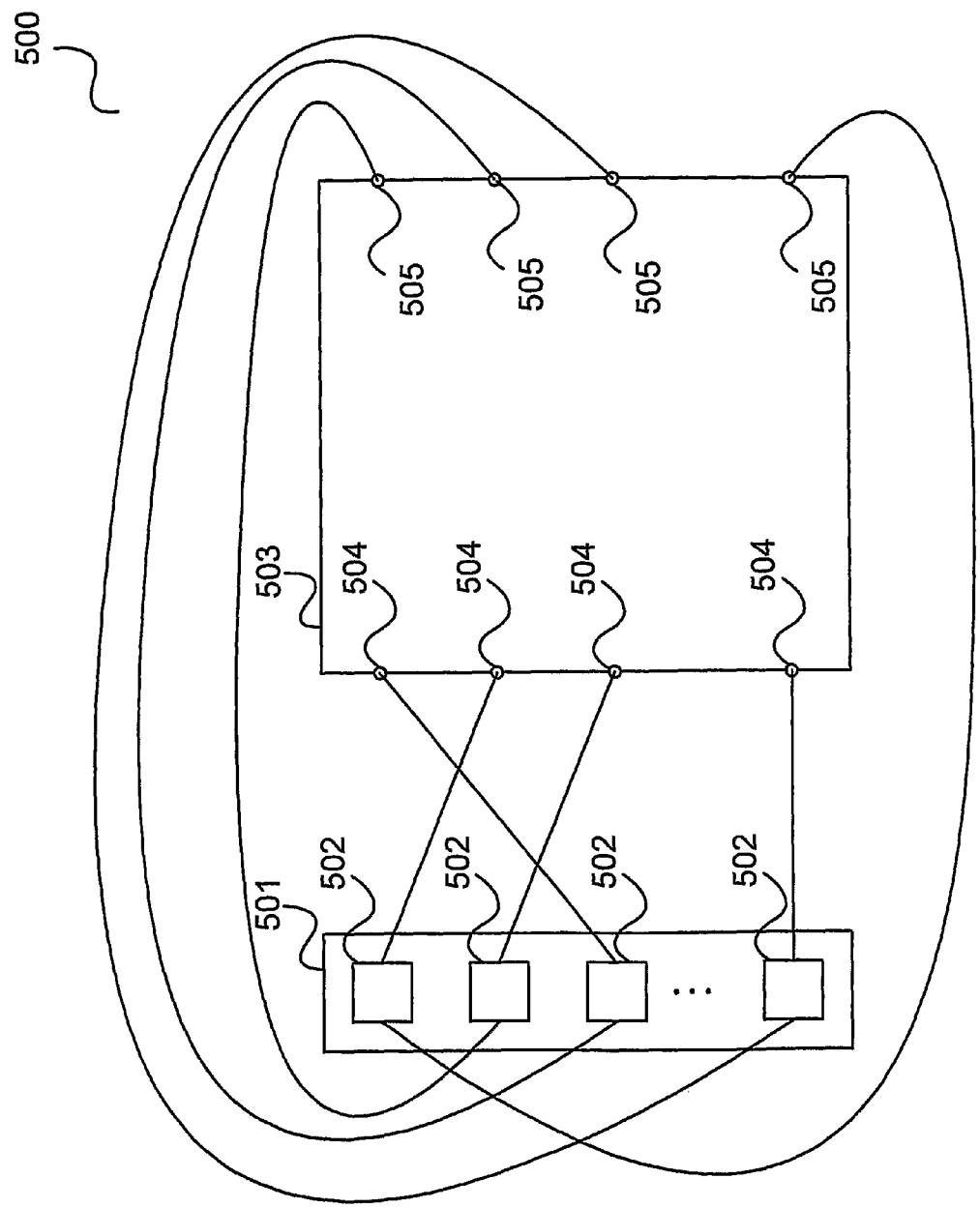
FIG. 5 shows a decoding circuit according to an embodiment.

FIG. 5 shows a decoding circuit 500 according to an embodiment.

The decoding circuit 500 comprises a data buffer 501 comprising a plurality of storage elements 502 for storing data symbols.

The decoding circuit 500 further comprises a processing circuit 503 comprising a plurality of inputs 504 and a plurality of outputs 505. The processing circuit 503 is configured to process data symbols received via the plurality of inputs 504 and output the processed data symbols via the plurality of outputs 505. Each storage element of the plurality of storage elements 502 is coupled to an associated input of the plurality of inputs 504, wherein the association of the plurality of storage elements with the plurality of inputs is determined by a first decoding parameter.

Each storage element of the plurality of storage elements 502 is coupled to an associated output of the plurality of outputs 505, wherein the association of the plurality of storage elements with the plurality of outputs is determined by a second decoding parameter.

The first decoding parameter and the second decoding parameter are determined by a decoding rule wherein the first decoding parameter and the second decoding parameter are not changed throughout the decoding process.

Illustratively, a coupling between the storage elements and the processing circuit in a decoding (encoding) circuit is kept constant during the decoding or encoding process, i.e. is selected in dependence of one or more parameters characterizing the decoding or encoding process, e.g. parameters given by the decoding or encoding scheme such as specified by a property code as for example given by a property of a parity check matrix.

In one embodiment, the first decoding parameter and the second decoding parameter are non-negative integers.

In one embodiment, the first decoding parameter and the second decoding parameter each specify a shift of a block of data symbols with respect to the plurality of inputs and the plurality of outputs.

In one embodiment, the decoding rule is given by an error correction code.

In one embodiment, the error correction code is a parity check code.

In one embodiment, the error correction code is a low density parity check code.

In one embodiment, the data symbols correspond to transmission symbols received via a communication channel.

In one embodiment, the data symbols are Log-Likelihood Ratios for the transmission symbols.

In one embodiment, the processing circuit is configured to check based on the data symbols whether a pre-determined criterion is fulfilled.

In one embodiment, the pre-determined criterion is based on a parity checking of the data symbols.

In one embodiment, each storage element is configured to output its stored data symbol to its associated input.

In one embodiment, each storage element is configured to, after outputting its stored data symbol to its associated input, receive another data symbol from its associated output, store the other data symbol and output the other data symbol to its associated input.

In one embodiment, the coupling of each storage element to its associated input is hard-wired.

In one embodiment, the coupling of each storage element to its associated output is hard-wired.

In one embodiment, the decoding circuit is a circuit for both encoding and decoding.

This means that in one embodiment, there is resource sharing between the encoder and the decoder.

In one embodiment, a method for decoding is provided comprising coupling each storage element of a plurality of storage elements for storing data symbols to an associated input of a plurality of inputs of a processing circuit being configured to process data symbols received via the plurality of inputs and output the processed data symbols via a plurality of outputs, wherein the association of the plurality of storage elements with the plurality of inputs is determined by a first decoding parameter; coupling each storage element of the plurality of storage elements to an associated output of the plurality of outputs, wherein the association of the plurality of storage elements with the plurality of outputs is determined by a second decoding parameter; wherein the first decoding parameter and the second decoding parameter are determined by a decoding rule and wherein the first decoding parameter and the second decoding parameter are not changed throughout the decoding process.

For example, the coupling according to the first decoding parameter and the second decoding parameter is not changed throughout the decoding process.

In one embodiment, a method for encoding is provided comprising coupling each storage element of a plurality of storage elements for storing data symbols to an associated input of a plurality of inputs of a processing circuit being configured to process data symbols received via the plurality of inputs and output the processed data symbols via a plurality of outputs, wherein the association of the plurality of storage elements with the plurality of inputs is determined by a first encoding parameter; coupling each storage element of the plurality of storage elements to an associated output of the plurality of outputs, wherein the association of the plurality of storage elements with the plurality of outputs is determined by a second encoding parameter; wherein the first encoding parameter and the second encoding parameter are determined by a encoding rule and wherein the first encoding parameter and the second encoding parameter are not changed throughout the decoding process.

For example, the coupling according to the first encoding parameter and the second encoding parameter is not changed throughout the decoding process.

The processing circuit is for example configured to pass the data symbols received via the plurality of inputs to the plurality of outputs (possibly processed).

The data buffer has for example M groups of storage units, each group comprising $K*R$ banks of storage units, each bank comprising N storage units;

The processing circuit for example includes N parity check units (e.g. check node processors), each parity check unit comprising $M*K*R$ inputs, having one input from each of said $M*K*R$ bank of storage units; and each parity check unit comprising $M*K*R$ outputs In one embodiment, the N outputs of the storage units of qth bank of pth group are associated to the $((p-1)*K*R+q)$th input of each of the said N parity check units For example, the $((r-1)*K*R+s)$th outputs of each of the N parity check unit are associated to the N inputs of the storage units of u th bank of r th group, s being different from u.

In one embodiment, the processing circuit comprises N/D parity check units, D being an integer number, N/D being an integer number, each parity check unit comprising $M*K*R$ inputs, having one input associated to each of said $M*K*R$ bank of storage units; and each parity check unit comprising $M*K*R$ outputs.

For example, a selected N/D outputs of the storage units of qth bank of pth group are associated to the $((p-1)*K*R+q)$th input of each of the said N/D parity check units, followed by another selected N/D outputs of the storage units of qth bank of pth group are associated to the same $((p-1)*K*R+q)$th input of each of the said N/D parity check units; so that all N outputs of the storage units of qth bank of pth group are associated to the same $((p-1)*K*R+q)$th input of each of the said N/D parity check units, in D rounds.

In one embodiment, the $((r-1)*K*R+s)$th outputs of each of the N/D parity check unit are associated with selected N/D inputs of the storage units of u th bank of r th group, s being different from u; followed by the same $((r-1)*K*R+s)$th output of each of the N/D parity check unit being associated to another selected N/D inputs of the storage units of u th bank of r th group; so that the same ((r−1)*K*R+s)th output of each of the N/D parity check unit being associated to all N inputs of the storage units of u th bank of r th group, in D round In one embodiment, the processing circuit, while encoding, processes the data symbol, after being passed between data buffer and itself for R times.

In one embodiment, one 'macro layer' of check nodes is updated in one cycle, independent of the check node weights. For the encoder, the encoding latency may be as small as the number of 'macro' layers of the parity check matrix. Embodiments may generate (at least) one bank of parity check bits at one clock cycle.

In one embodiment, a decoder circuitry for decoding a received data stream encoded according to a low density parity check (LDPC) code is provided, wherein the circuitry comprises a variable node memory for storing the initial probability values and the subsequent updated probability values, parity check update units, for updating the probability values and generating check note values, hard-wired interconnections, for routing said probability values from the output of said variable node memory to said set of parity check update units (e.g. parity check units), and hard-wired interlinks, for linking said updated probability values from said set of parity check update units to the variable node memory.

In one embodiment, the parity check units process the subsequent updated probability values, after being passed between different variable node memory and different parity check update units for B*R times, B being an integer number.

In one embodiment, the hard-wired interlinks route the ((r−1)*K*R+s)th output of each of the N/D parity check update units to a selected N/D inputs of the storage units of u th bank of r th group, s being different from u; followed by the same ((r−1)*K*R+s)th output of each of the N/D parity check update units being routed to another selected N/D inputs of the storage units of u th bank of r th group; so that the same ((r−1)*K*R+s)th output of each of the N/D parity check update unit being routed to all N inputs of the storage units of u th bank of r th group.

A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment. A "block" may for example be understood to be a circuit.

Figure 6:
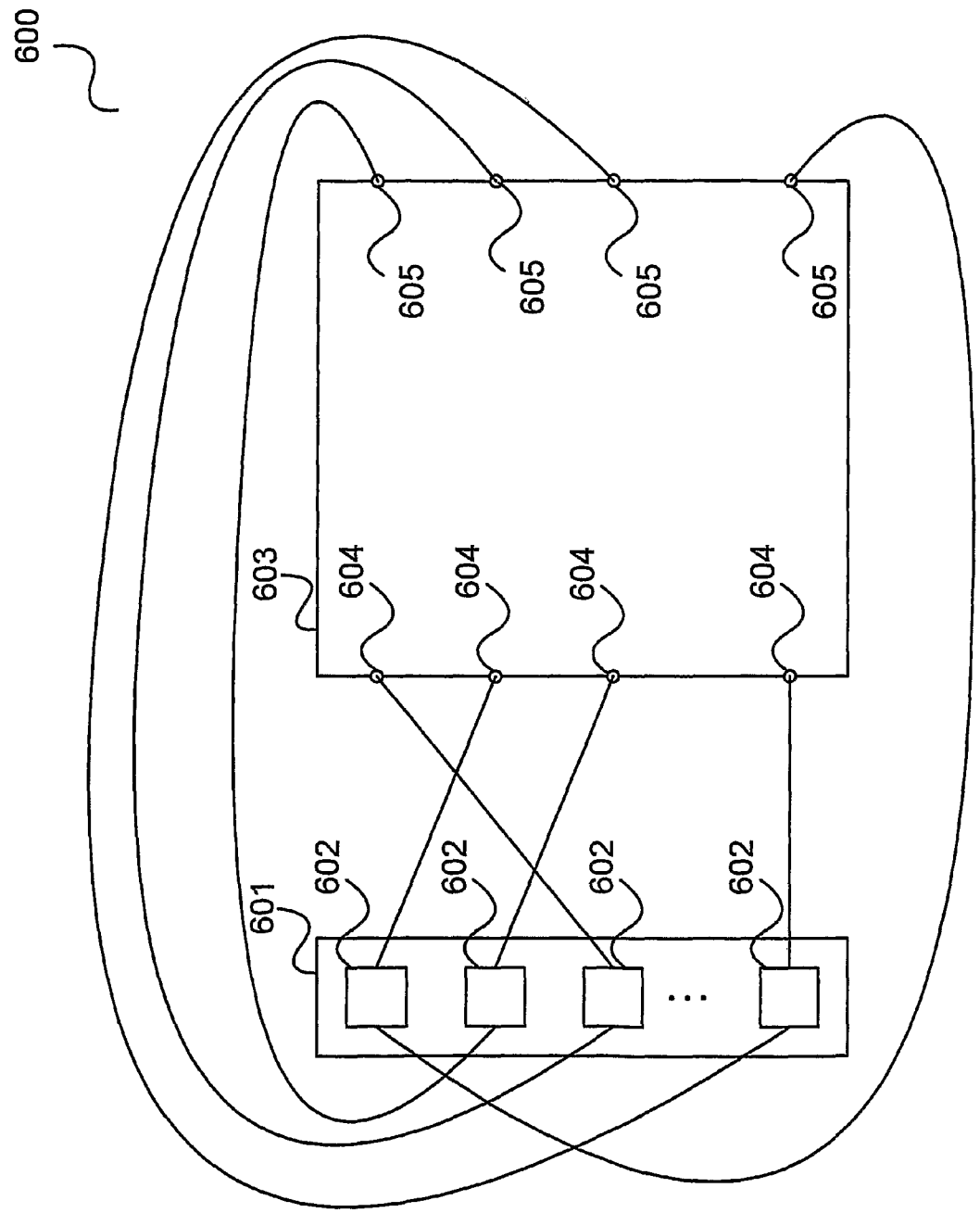
FIG. 6 shows an encoding circuit according to an embodiment.

FIG. 6 shows an encoding circuit 600 according to an embodiment.

The encoding circuit 600 comprises a data buffer 601 comprising a plurality of storage elements 602 for storing data symbols. The encoding circuit 600 further comprises a processing circuit 603 comprising a plurality of inputs 604 and a plurality of outputs 605. The processing circuit 603 is configured to process data symbols received via the plurality of inputs 604 and output the processed data symbols via the plurality of outputs 605. Each storage element of the plurality of storage elements 602 is coupled to an associated input of the plurality of inputs 604, wherein the association of the plurality of storage elements with the plurality of inputs 604 is determined by a first encoding parameter.

Further, each storage element of the plurality of storage elements 602 is coupled to an associated output of the plurality of outputs 605, wherein the association of the plurality of storage elements with the plurality of outputs 602 is determined by a second encoding parameter.

The first encoding parameter and the second encoding parameter are determined by an encoding rule wherein the first decoding parameter and the second encoding parameter are not changed throughout the encoding process.

The data symbols are for example (at least partially) information bits to be encoded. The encoder for example generates parity check bits for the information bits.

In one embodiment, the processing circuit, while decoding, processes the subsequent updated probability values, after being passed between data buffer and itself for B*R times, B being an integer number.

The processing circuit may be used for both encoding and decoding, i.e. the circuits 500 and 600 may be combined into one circuit.

In one embodiment, a communication system comprising a receiver with a decoding circuit as described above and a transmitter with an encoding circuit as described above is provided.

An example for a high throughput LDPC decoder architecture according to one embodiment is described in the following with reference to FIG. 7.

Figure 7:
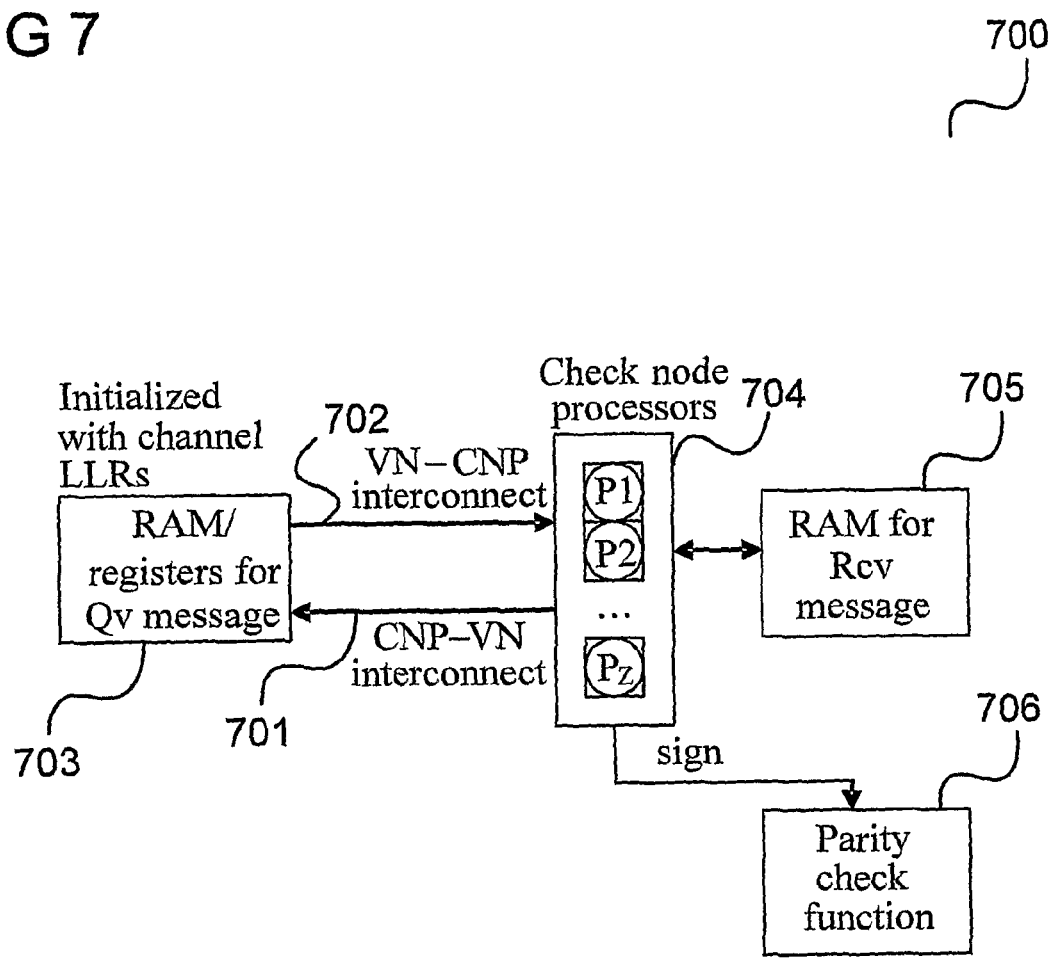
FIG. 7 shows a decoding circuit according to an embodiment.

FIG. 7 shows a decoding circuit 700 according to an embodiment.

In one embodiment, layered decoding is employed for better convergence, as described in copending and commonly assigned application Ser. No. 10/806,879 filed Mar. 23, 2004, published as U.S. Patent Application Publication No. US 2005/0204271 A1, incorporated herein by reference. In FIG. 7, the input/output buffering registers are not shown for simplicity.

The decoding circuit 700 comprises a memory 703 storing the Log-Likelihood Ratios (LLRs) for a received codeword (i.e. is in one embodiment initialized with the Log-Likelihood Ratios for the received codeword or an a-priori estimate for the received code word).

The memory 703 interchanges the a posteriori LLR (Qv) messages with a check node processor array 704 by means of a first Interconnection 701 and a second interconnection 702. For example, the data symbols stored in the memory 703 are updated (starting from the LLR for the received codeword supplied by the receiving circuit 310) in each iteration to a-posteriori estimates Qv.

In one embodiment, unlike conventional decoders, the interconnections 701, 702 between the memory 703 and the check node processor array 704 are hardwired without complicated control logic and banks of multiplexers. Furthermore, in one embodiment, the decoding circuit 700 does not include a memory for storing the parity check matrix.

Figure 8:
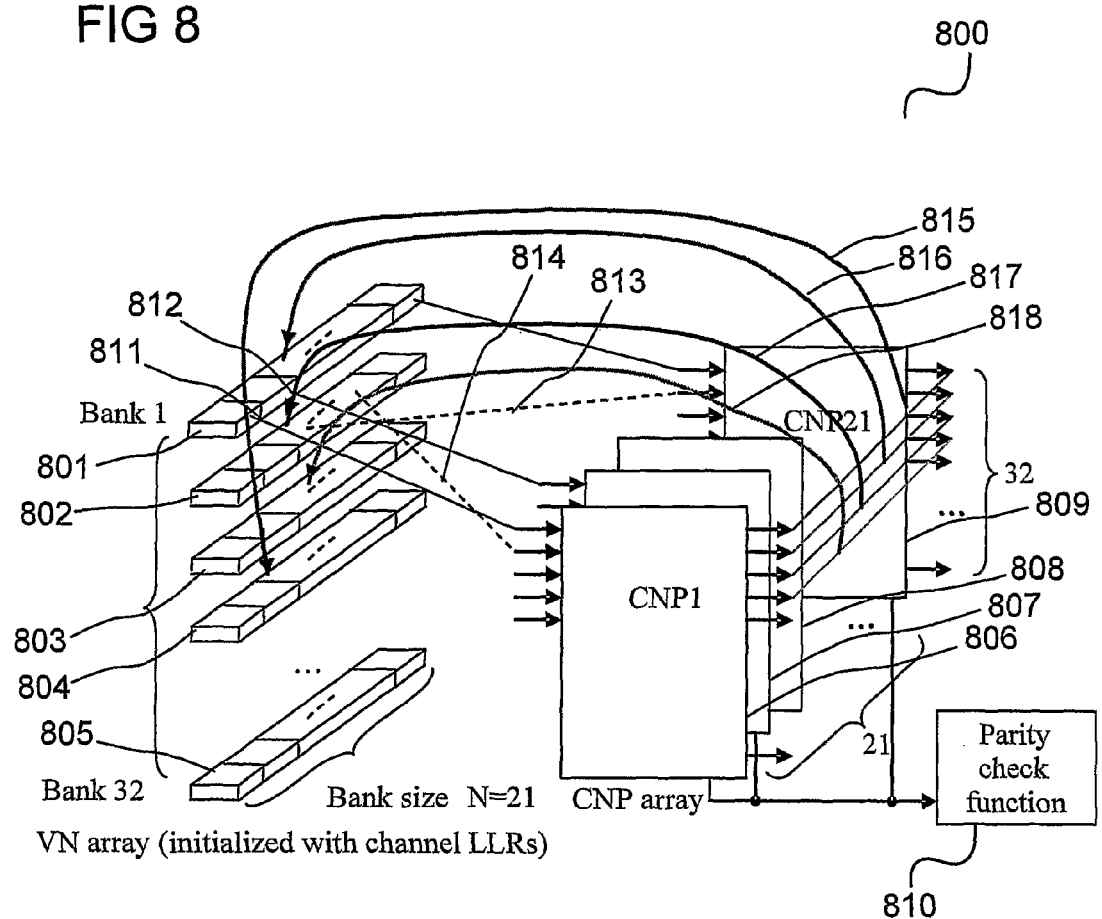
FIG. 8 shows a decoder according to an embodiment.

An example of a more detailed structure of the LDPC layered decoder in accordance with one embodiment is shown in FIG. 8.

FIG. 8 shows a decoder 800 according to an embodiment.

In this example, the memory 703 is a variable node (VN) array including a plurality of memory banks 801-805 (numbered 1 to 32) and the check node processor array includes a plurality of check node processors 806-809.

In this example, the number of memory banks (32) and the number of check node processors (21), the number of inputs and outputs of each check node processor (32) as well as the interconnection between the memory banks and the check node processors (corresponding to the interconnections 701, 702) corresponds to the LDPC codes defined in IEEE 802.15.3c draft as given by the parity check matrices 401, 402, 403 illustrated in FIG. 4.

The Variable Node (VN) array 801-805 is a variable node memory. The array 801-805 is initialized with the channel LLRs, i.e. with the log-likelihood ratios for the current codeword (i.e. the codeword to be currently decoded) supplied by the receiving circuit 308.

The length of the array 801-805 is the codeword length 672. The banks 801-805 are grouped into M=8 groups. Each bank 801-805 comprises N=21 storage units. The 21 storage units of each bank 801-805 are connected to the input of the 21 check node processors 806-809, wherein each storage unit is coupled to the input of exactly one check node processor 806-809.

The decoding circuit 800 includes a parity check function block 810 to test the convergence of the decoding process (for example comprising a plurality of iterations) and to provide the inherent early stop mechanism for the decoder.

As illustrated in FIG. 7, there are two interconnections 701, 702 which may be seen as two types of routing networks, i.e., the VN-to-CNP network and the CNP-to-VN network. In one embodiment, these networks are hardwired.

The connection between the output of the VN array 801-805 (i.e. the storage elements of the banks 801-805) and the inputs of the CNP array 806-809 may be seen to be given by a first decoding parameter, namely by the first block-row of the third parity-check matrix 403 in a cyclic shift manner.

For example, since H(1,1)=0 (please note that H is interpreted here as a 4×32 matrix of sub matrices; an entry i thus denotes the permutation matrix $P_i$), the first VN bank 801 is to be connected to the first input of each CNP in a 1-to-1 manner without permutation, i.e. the first storage element of the first VN bank 801 is coupled to the first input of the first CNP 806, the second storage element of the first VN bank 801 is coupled to the first input of the second CNP 807 and so on.

This part of the VN-to-CNP interconnection is illustrated as first bank connections 811 and 812 in FIG. 8.

Since H(1,2)=18, the second VN bank 802 is to be connected to the second input of each CNP in a way that VN2(19)→CNP1, VN2(20)→CNP2, ..., VN2(2)→CNP5, VN2(1)→CNP4, wherein VN2(i)→CNPj means that the ith storage element of the second bank 802 is coupled with the (second) input of the jth CNP.

This part of the VN-to-CNP interconnection is illustrated as second bank connections 813 and 814 in FIG. 8.

The CNP-to-VN interconnection, i.e. the connection between the outputs of the CNP array 806-809 and the inputs of the VN array 801-805 may be seen to be given by a second decoding parameter, namely the 4-cyclic structure of the third parity check matrix 403. For example, the order of the first four entries 404, 405, 406, and 407 (from left to right) in the first block-row of the third parity matrix 403 occur in the second block-row of the third parity check matrix 403 in the order fourth entry 407, first entry 404, second entry 405, and third entry 406, i.e. according to a one cycle right shift compared to the first row.

The CNP-to-VN interconnection corresponding to this regular code structure, i.e. the routing network from CNPs 806-809 to VN array 801-805 is illustrated as first group connections 815 to 818 in FIG. 8. Please note than one may consider the banks 801-805 forming M=8 groups of four banks each according to this cyclic CNP-to-VN interconnection structure.

The first group connections 815 to 818 comply with the cyclic structure of the code given by the third parity check matrix 403 in FIG. 4: The second outputs of the CNP array (i.e. the second outputs of all CNPs 806-809) are coupled to the first VN bank 801 via connection 816, the third outputs of the CNP array are coupled to the second VN bank 802 via connection 817, the fourth outputs of the CNP array are coupled to the third VN bank 803 via connection 818, and the first outputs of the CNP array are coupled to the fourth bank 804 via connection 815.

The VN-to-CNP interconnection in this way facilitates the decoding process to update the messages in one block row in one cycle, and start to process the message of the next block row in the next cycle. With this architecture, only four cycles are needed for one iteration of the decoding process. This is true not only for the code corresponding to the third parity check matrix 403 but also for the codes corresponding to the first parity check matrix 401 and the second parity check matrix 402 as will be explained in more detail below.

With the direct hardwired VN-to-CNP and CNP-to-VN interconnections, the exemplary architecture illustrated in FIG. 8 is especially well suited for the LDPC codes corresponding to the parity check matrices 401, 402, and 403.

Figure 9:
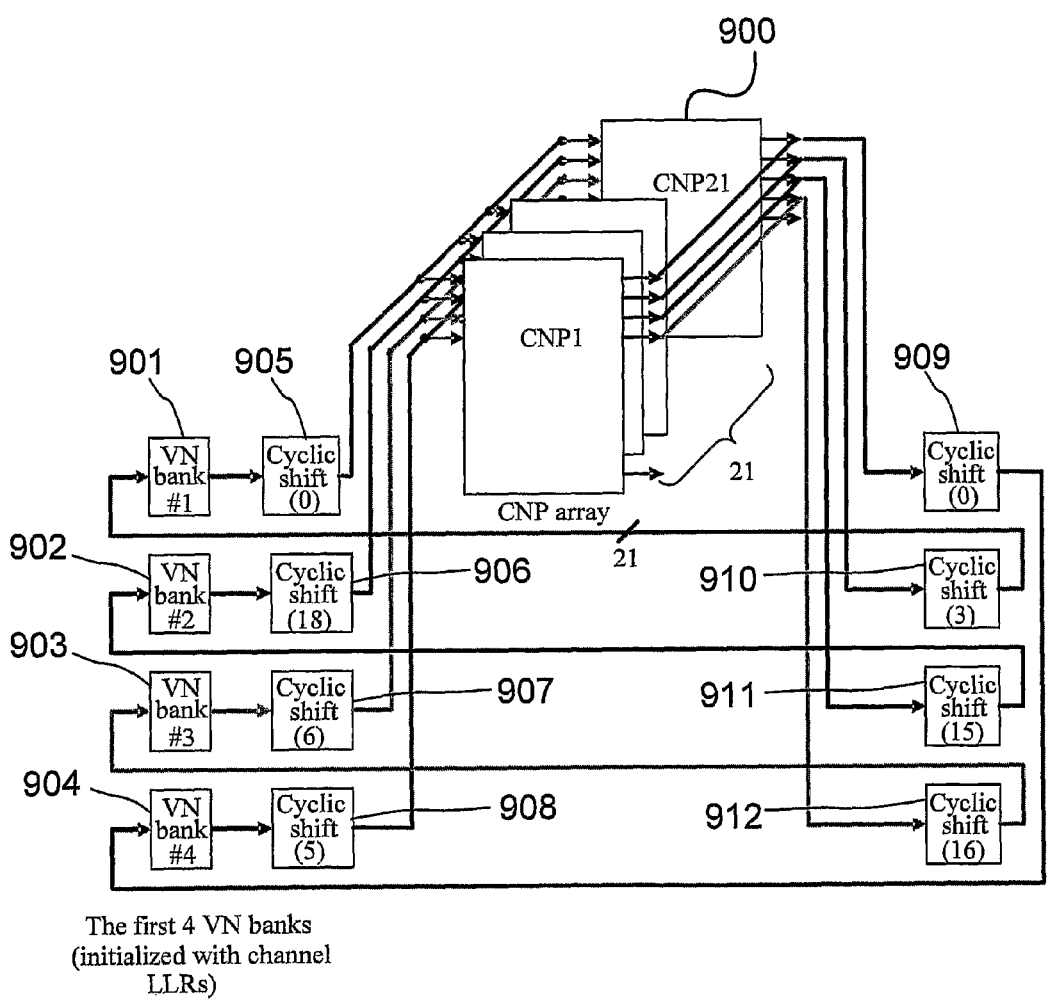
FIG. 9 shows VN-to-CNP and CNP-to-VN interconnections according to an embodiment.

The VN-to-CNP and CNP-to-VN interconnections of the first group of banks (banks 801-804) according to one embodiment are illustrated in FIG. 9.

FIG. 9 shows VN-to-CNP and CNP-to-VN interconnections according to an embodiment.

A CNP array 900 corresponds to the CNP array 806-809.

A first bank 901, a second bank 902, a third bank 903, and a fourth bank 904 correspond to the first group of banks 801-804. The interconnection illustrated in FIG. 9 thus illustrates the connection in accordance with the first four entries of the third parity check matrix 403.

Specifically, first cyclic shift blocks 905-908 correspond to the first four entries of the third parity check matrix 403 and each first cyclic shift block 905-908 carries out a cyclic shift of the data symbols stored in the corresponding bank 901-904 in accordance with the corresponding entry of the third parity check matrix 403 (i.e. the corresponding permutation matrix).

To be in the correct order for the next cycle, the outputs of the CNP array 900 are cyclically shifted by second cyclic shift blocks 909-912 which carry out the reverse cyclic shift to the cyclic shift carried out by the first cyclic shift blocks 905-908. Specifically, a cyclic shift of 0 is reversed by a cyclic shift of 0, a cyclic shift of 18 is reversed by a cyclic shift of 3 (to have 21 total which corresponds to 0 because of the length of 21 of each bank 901-904), a cyclic shift of 6 is reversed by a cyclic shift of 15 (to have 21 total), and a cyclic shift of 5 is reversed by a cyclic shift of 16 (to have 21 total).

The cyclic shift shown as the cyclic shift blocks 901-904, 909-912, are, in one embodiment, as shown in FIG. 8, realized by a corresponding wiring of storage elements to inputs and outputs to storage elements, respectively.

Figure 10A:
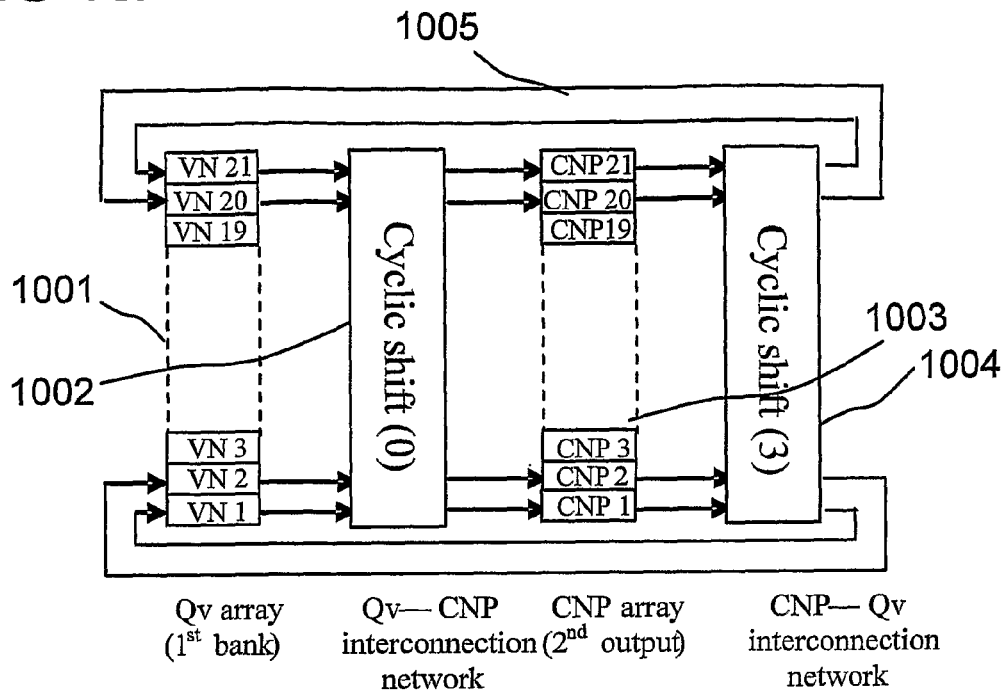
FIGS. 10A and 10B illustrate VN-to-CNP and CNP-to-VN interconnections for one VN bank according to an embodiment.
Figure 10B:
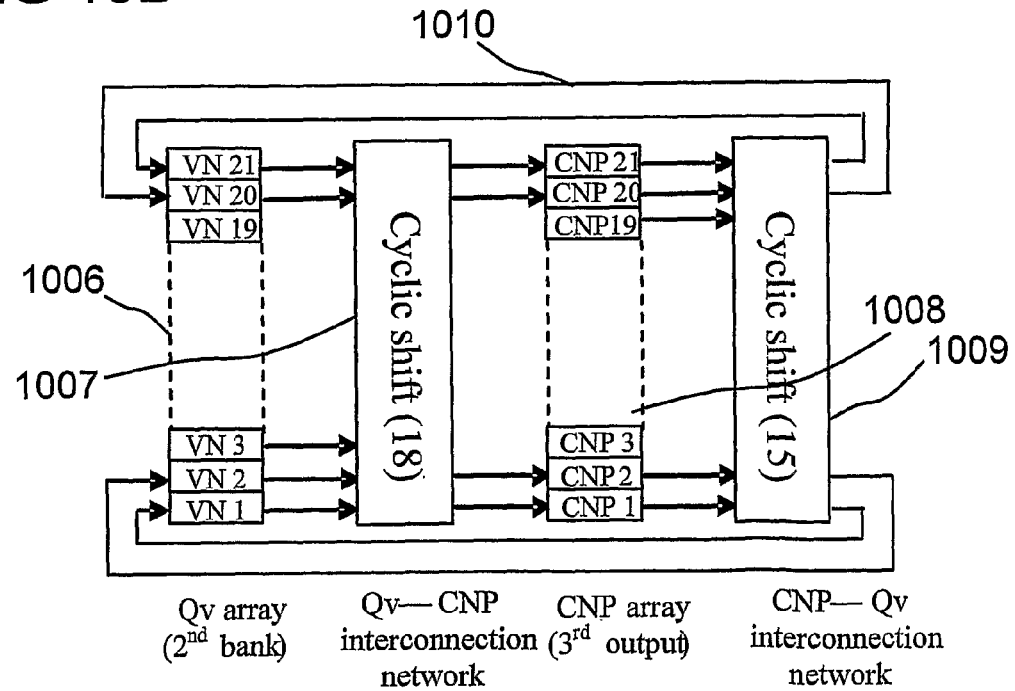

The input/output wiring of the first VN bank 901 is illustrated in FIG. 10A and the input/output wiring of the second VN bank 902 is illustrated in FIG. 10B in a "top view".

FIGS. 10A and 10B illustrate VN-to-CNP and CNP-to-VN interconnections for one VN bank according to an embodiment.

CNP arrays 1003, 1008 correspond to the CNP array 900. A first bank 1001 corresponds to the first bank 901 and a second bank 1006 corresponds to the second bank 902. First cyclic shift blocks 1002, 1007 correspond to first cyclic shift blocks 905, 906, respectively, and second cyclic shift blocks 1004, 1009 correspond to second cyclic shift blocks 909, 910, respectively.

The output of the first bank 1001 connects directly to the first input of the CNP array 1003 through O-shift first cyclic shift unit 1002. The input of the first bank 1001 comes from the second output of the CNP array 1003, as specified by the 4-cyclc cyclic structure of the parity check matrix 403. The CNP-to-VN interconnection cyclic shift (illustrated by cyclic shift block 1004) is the reverse shift of the cyclic shift of the VN-to-CNP interconnection (illustrated by cyclic shift block 1007) of the second VN bank 1006 to the second input of CNP array 1008 (cyclic shift 3).

A first plurality of connections 1005 are direct 1-to-1 connections between (first bank) second cyclic shift block 1004 and the first bank 1001. Please note that the cyclic shift of the cyclic shift block 1004 can be realized by a corresponding wiring.

The outputs of the second bank 1006 are coupled to the second inputs of the CNP array 1008 via the (second bank) first cyclic shift block 1007 implementing a cyclic shift of 18 since H(1,2)=18.

The cyclic shift of the CNP-to-VN interconnection (illustrated by cyclic shift block 1009) is the reverse of the cyclic shift of the VN-CNP interconnection of the third VN bank 903 to the third input of CNP array 900. A second plurality of connections 1010 are direct 1-to-1 connections between (second bank) second cyclic shift block 1009 and the second bank 1006.

Figure 11:
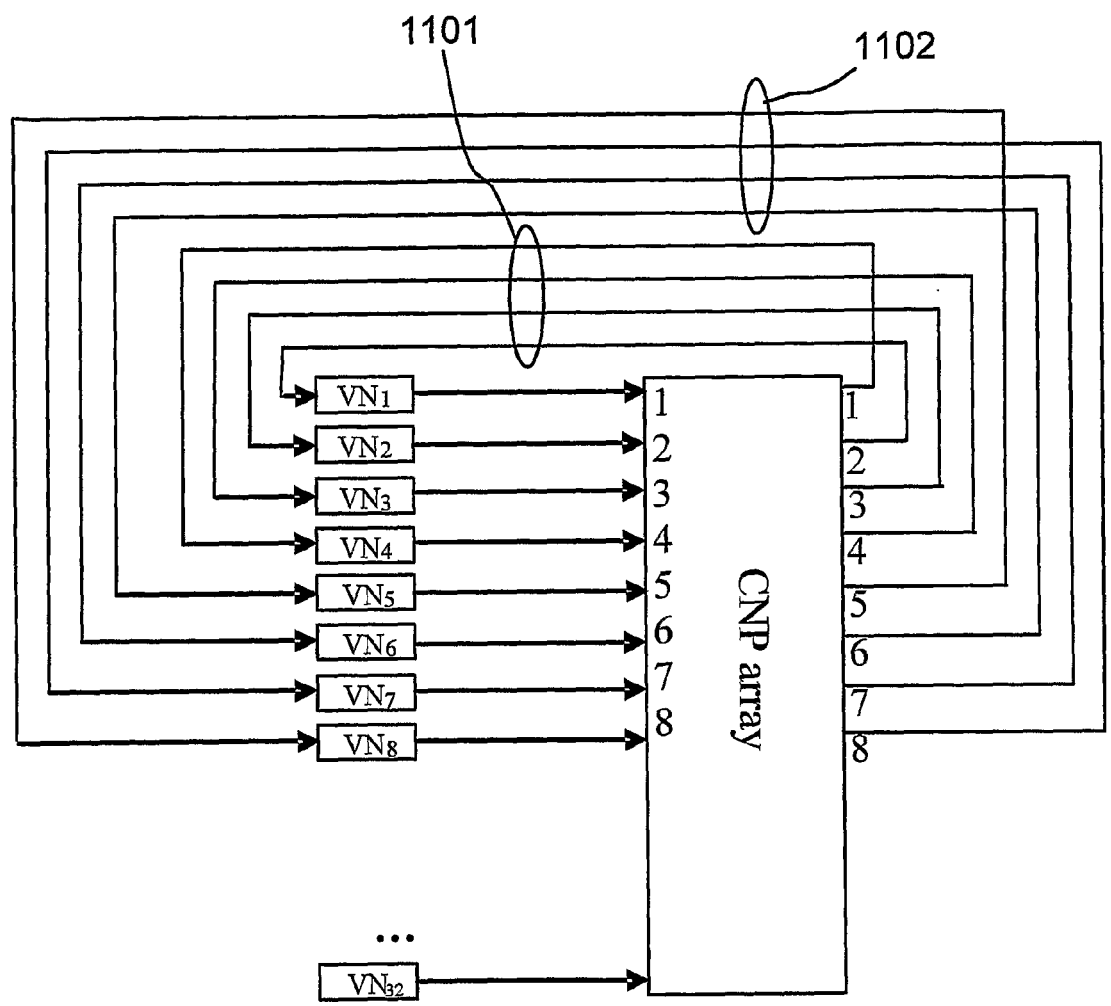
FIG. 11 illustrates a VN-to-CNP interconnection according to an embodiment.

The input/output wiring of the VN banks 801-805 with the CNP array 806-809 is illustrated in FIG. 11 in a "front view".

FIG. 11 illustrates a VN-to-CNP interconnection according to an embodiment.

The illustration of the VN-to-CNP interconnection as shown in FIG. 11 shows the correspondence of the VN-to-CNP interconnection with the 4-cyclic structure of the code corresponding to the third parity check matrix 403.

First group connections 1101, corresponding to the first group connections 815 to 818, comply with the cyclic structure of the code given by the third parity check matrix 403: The first group connections 1101 connect CNP2→VN1, i.e. the second outputs of the CNP array are coupled to the first VN bank designated by $VN_1$ via the first group connections 1101.

Analogously, the first group connections 1101 connect CNP3→VN2, CNP4→VN3, and CNP1→VN4. The connection of the first group connections 1101 corresponds to the 4-cyclic structure of the block columns 1 to 4 of the third parity check matrix 403 (i.e. the cyclic right shift by one from block-row to block row in the first four block columns 1-4).

Further, similarly, second group connections 1102 connects CNP6→VN6, CNP7→VN6, CNP8→VN7, and CNP5→VN8 corresponding to the 4-cyclic structure of the third parity check matrix 403. The connection of the second group connections 1102 corresponds to the 4-cyclic structure of the block columns 5 to 8 of the third parity check matrix 403 (i.e. the cyclic right shift by one from block-row to block row in the second four block columns 5-8).

For the other six bank groups the VN-to-CNP interconnection (VN-to-CNP network) includes similar group connections that take account of the four cyclic structure of the respective block columns of the third parity check matrix 403.

It has been found that the particular sequence in which the block-rows of the parity check matrices are processed can affect the decoding performance. The natural sequence discussed above and illustrated in FIG. 8 is for illustration purpose only. In other embodiments, better error rate performance may be obtained by the re-ordering of the block-row decoding sequence. For this, the interconnections illustrated in FIG. 8 may be rewired.

Figure 1:
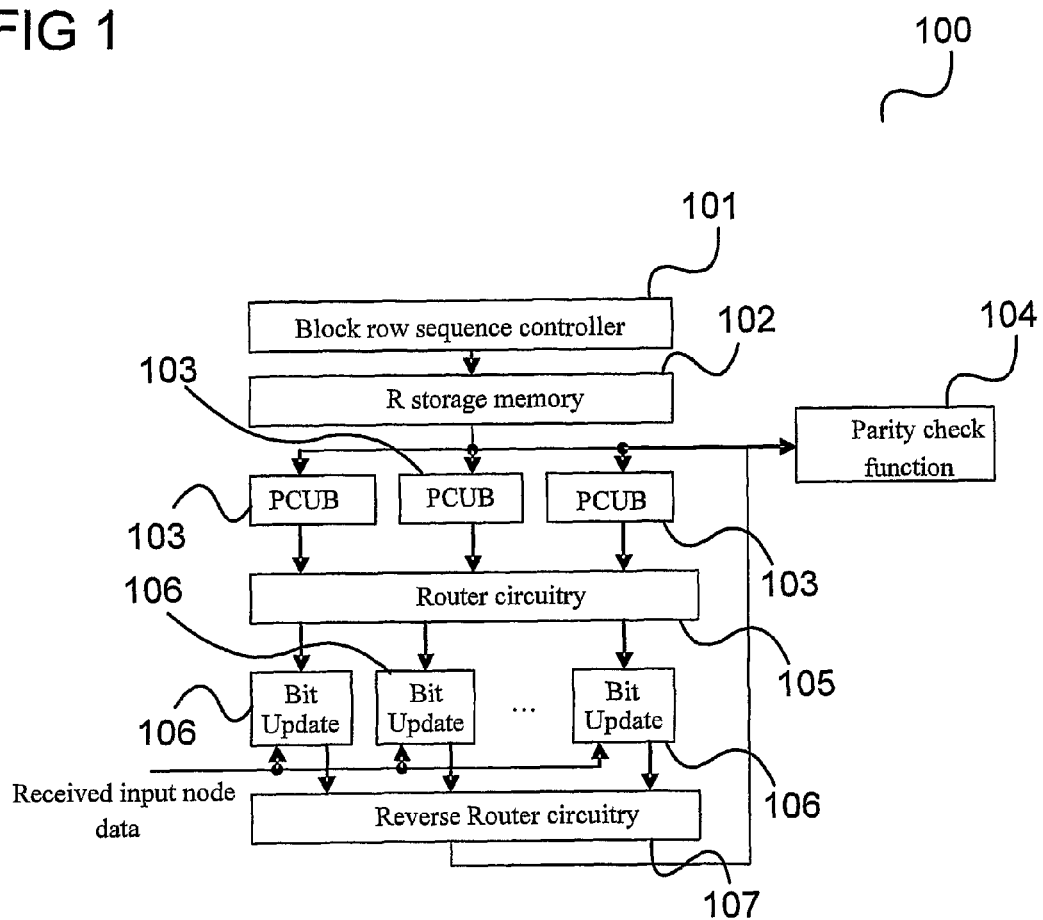
FIG. 1 shows a conventional LDPC decoder.
Figure 2:
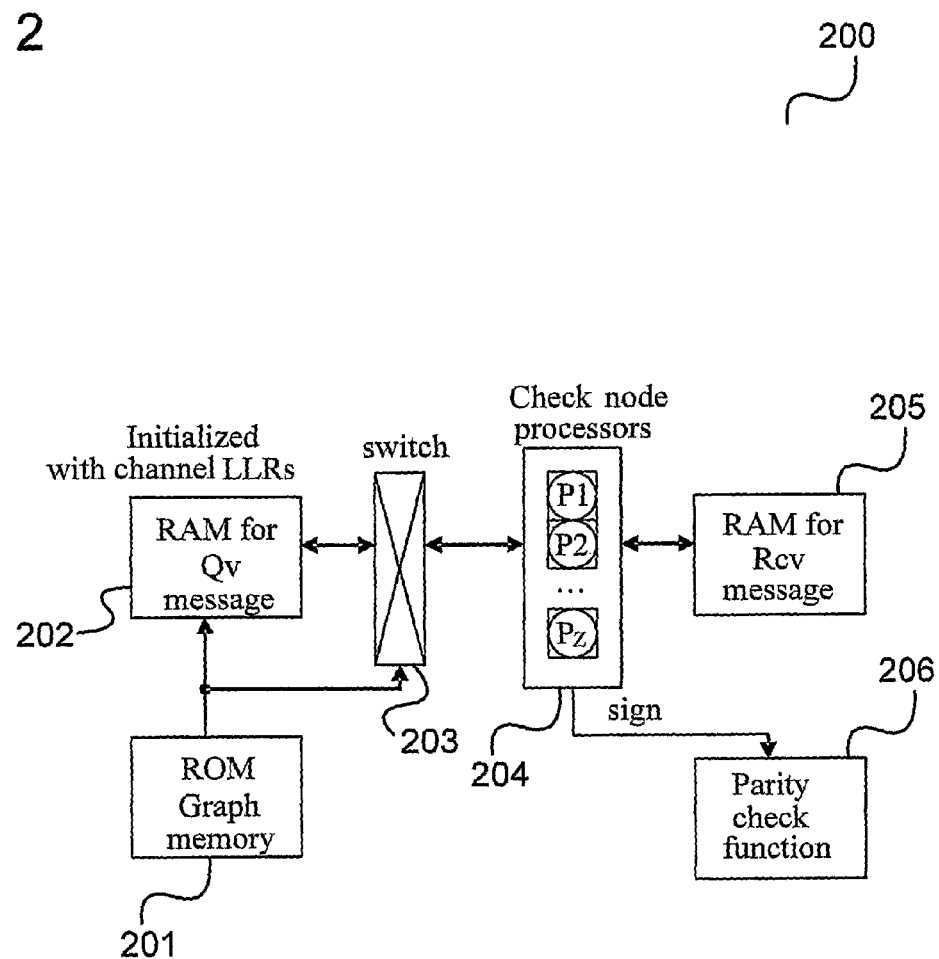
FIG. 2 shows a conventional LDPC decoder.

Table 1 gives a comparison between the architecture illustrated in FIG. 1, the architecture illustrated in FIG. 2 and the architecture of an embodiment, e.g. similar to the one described above with reference to FIG. 8.

TABLE 1

| Method | Architecture of FIG. 1 | Architecture of FIG. 2 | Embodiment |
| --- | --- | --- | --- |
| CNPs -> VNs interconnect | Bank of multiplexers | Bank of multiplexers | hardwired |
| VNs -> CNPs interconnect | Bank of multiplexers | Bank of multiplexers | hardwired |
| ROM to store Hs | yes | yes | no |
| RAM to store R and LLR | Same | Same | Same |
| Bit node update | Complicated | Simple | Simple |
| Overall memory requirement | High | High | Low |
| Overall Complexity | High | High | Low |
| Throughput | Low | Low | High |
| Cyclicity Requirement on the H | no | no | yes |

Figure 12:
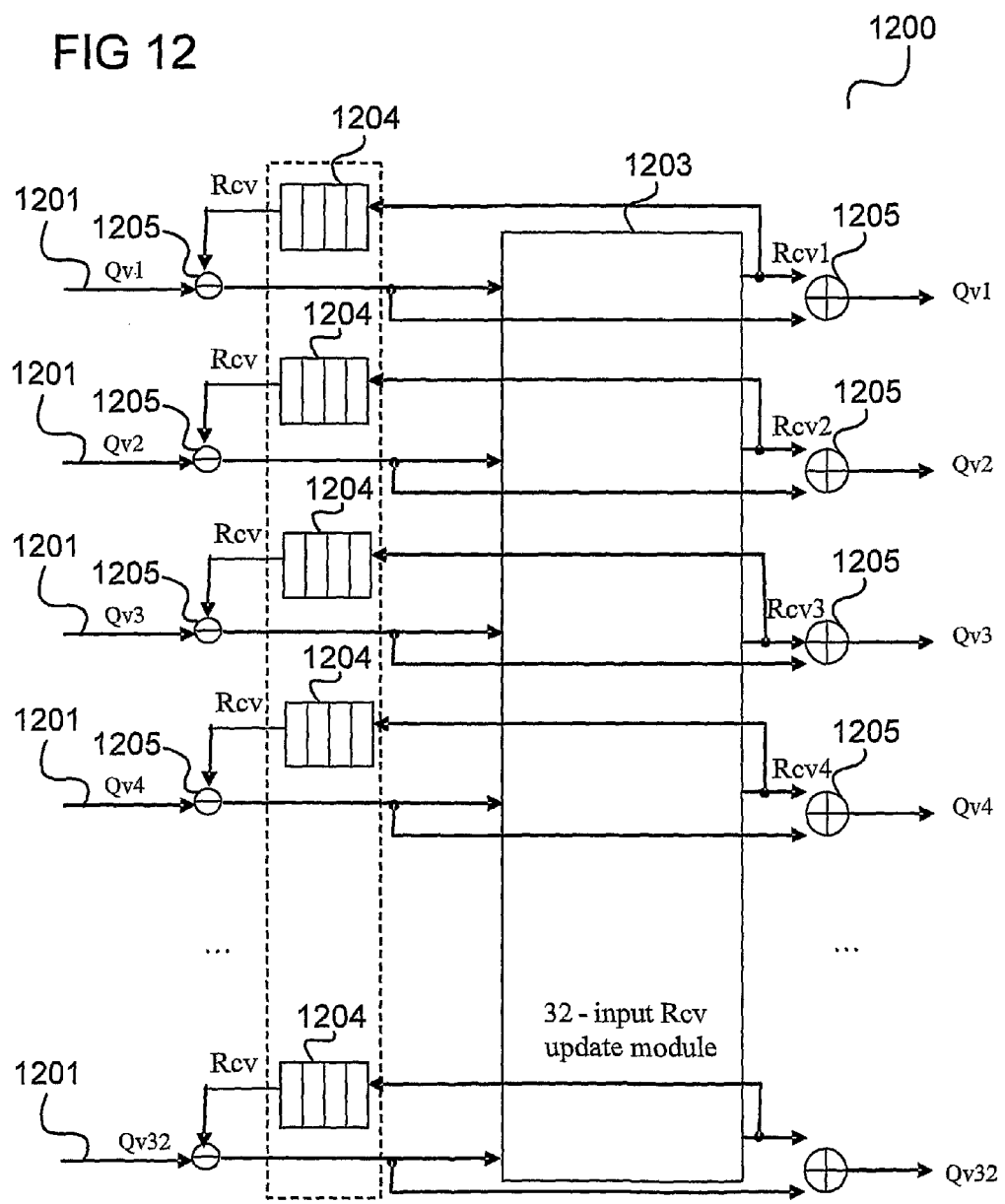
FIG. 12 shows a check node processor according to an embodiment.

The architecture of a check node processor according to an embodiment is illustrated in FIG. 12.

FIG. 12 shows a check node processor 1200 according to an embodiment.

The check node processor 1200 includes a plurality of inputs 1201 coupled, as described above, with the outputs of the VN banks 801 to 805.

The check node processor 1200 further includes a plurality of outputs 1202 coupled, as described above, with the inputs of the VN banks 801 to 805.

Corresponding to the example illustrated in FIG. 8, the check node processor includes 32 inputs 1201 and 32 outputs 1202.

Via each input, the check node processor 1200 receives an a-posteriori estimate Qv and outputs an updated a-posteriori estimate Qv via the respective output.

To decode one block-layer in just one cycle, the data path of the CNP 1200 is, in one embodiment, purely combinational.

An Rcv update module 1203 performs updates of the probability values Rcv.

An updated Rcv value output by the Rcv update module 1203 is feedback to a respective memory 1204 corresponding to the same VN bank as the Qv value from which the updated Rcv value was generated.

Each memory 1204 is operated in a first-in first-out (FIFO) manner, for example implemented with shift registers or a RAM and is configured to store four values. Since in each cycle, one Rcv value is generated and fed to the memory 1204, an updated Rcv value will be output by the memory 1204 after four cycles (i.e. in the next iteration) and the updated Rcv value will thus be output by the memory 1204 in the cycle when the rightful Qv is input, the Qv corresponding (i.e. being an update of) the Qv value from which the Rcv value was generated. This is because the Qv values follow the four cycle structure (e.g. illustrated in FIG. 11) and re-visit (possibly updated) a VN bank every four cycles and thus are re-input (possibly updated) via an input 1201 every four cycles.

An Rcv value output by a memory 1204 is subtracted from the Qv value received by the corresponding input 1201 by a subtractor 1205. The result is fed to the Rcv updated module 1203 and to an adder 1205 where it is added to the updated Rcv value to generate the updated Qv value.

The architecture of the Rcv update module 1203 according to an embodiment is explained in the following with reference to FIGS. 13 and 14. In this embodiment, the normalized min-sum algorithm (NMS) is adopted for illustration.

Figure 13:
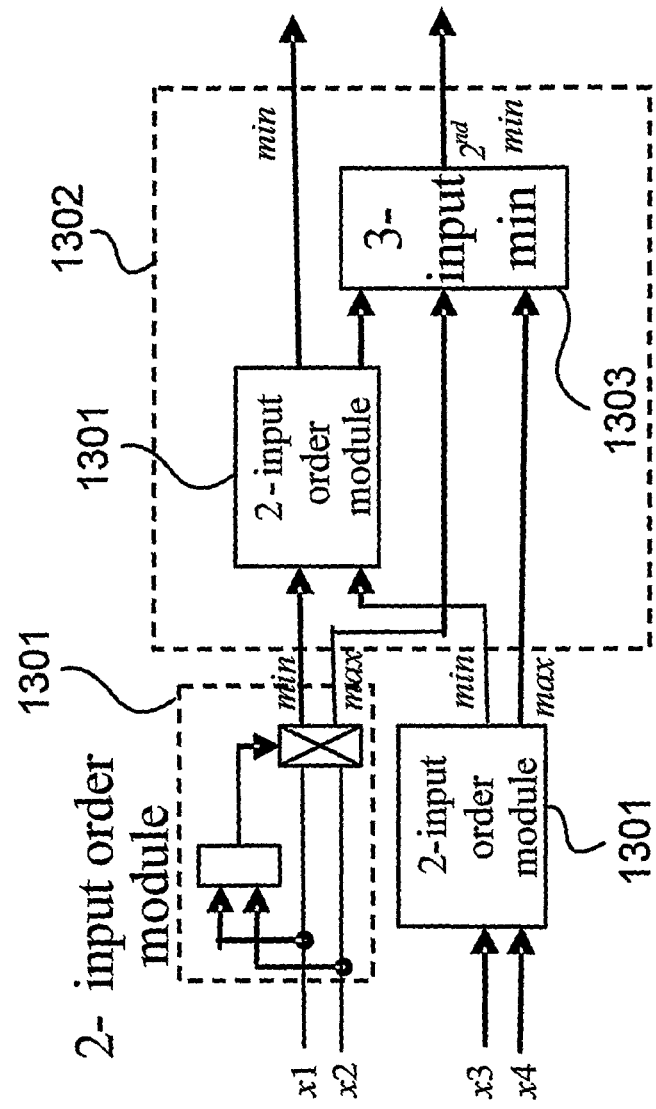
FIG. 13 illustrates the circuit design for a 2-input order module and a 4-input order module.

FIG. 13 illustrates the circuit design for a 2-input order module 1301 and a 4-input order module 1302.

The 2-input order module 1301 compares two amplitude inputs and outputs them in a sorted manner (the minimum via the upper output and the maximum of the two values via the lower output). The 4-input order module 1302 takes two groups of pre-ordered amplitude inputs (i.e. each group is ordered into minimum and maximum of the group) and outputs the minimum and the second minimum (i.e. outputs the two lowest values of the four input values x1 to x4). As shown, the pre-ordering of the input to the 4-input order module 1302 is achieved by two 2-input order modules 1301 coupled in front of the 4-input order module 1302. To determine the second minimum, a 3-input minimum module 1303 (i.e. a module outputting the least value of three input values) is used by the 4-input order module.

The indexing of the minimum is not shown in FIG. 13 for simplicity.

Figure 14:
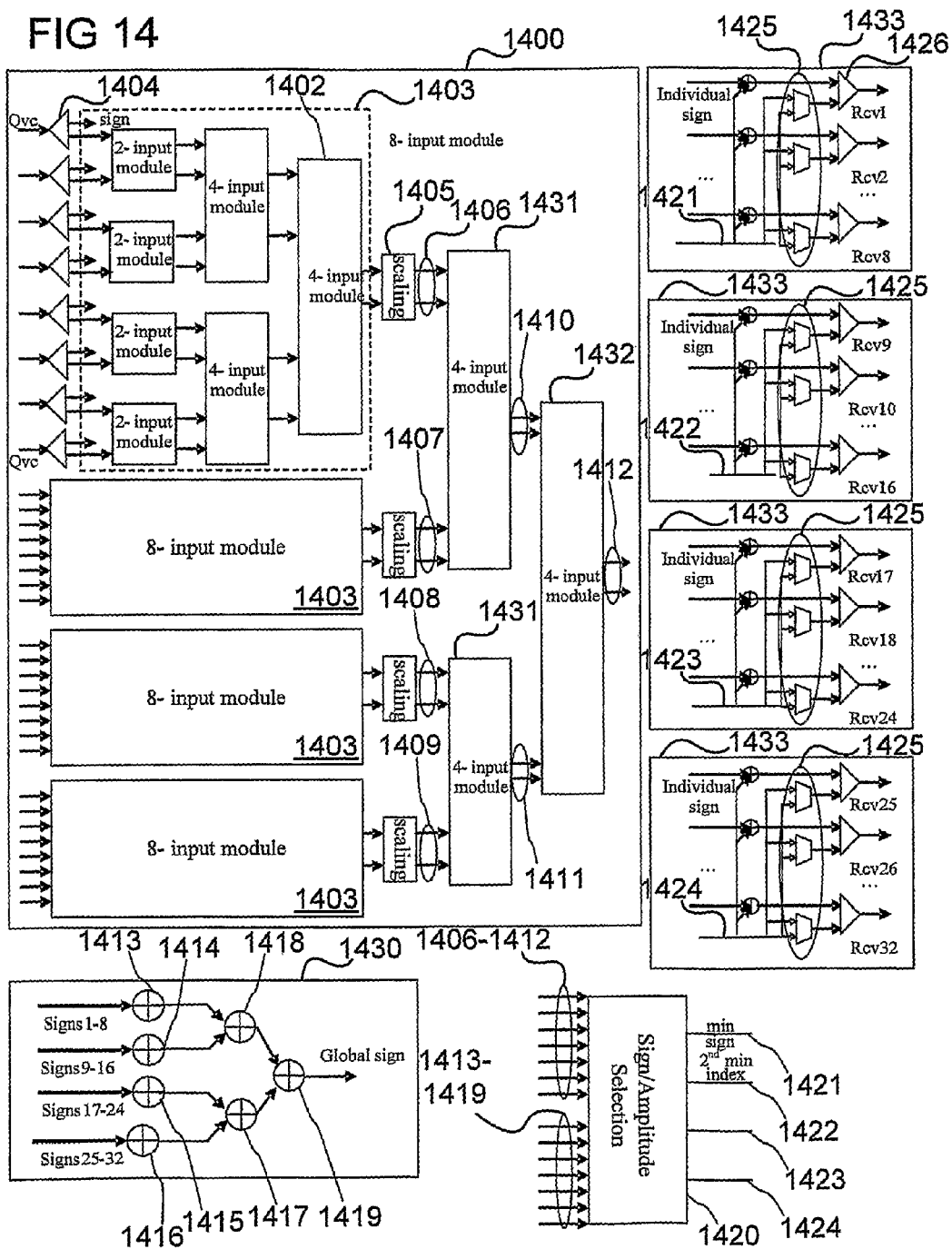
FIG. 14 shows an Rcv update module according to an embodiment.

An Rcv update module based on the 2-input module 1301 and the 4-input module 1302 is illustrated in FIG. 14.

FIG. 14 shows an Rcv update module 1400 according to an embodiment.

Corresponding to the number of VN banks in the example shown in FIG. 8, the Rcv update module 1400 is a 32-input Rcv update module. The Rcv update module 1400 is purely combinational.

The Rcv update module 1400 includes four 8-input modules 1403 wherein the structure of the 8-input modules 1403 is illustrated for the uppermost 8-input module 1403 as an example.

The 8-input modules 1403 include, for each of their inputs, a splitting unit 1404 which splits, for a value received via the input, the value into its sign (output from the upper output of the splitting unit 1404") and its amplitude (output from the lower output of the splitting unit 1404).

The signs of the 32 input values, numbered from 1 to 32 are grouped into four groups of eight signs. These four groups are input to a sign determination, circuit 1430 which may be part of the Rcv update module 1400 but is shown separately in FIG. 14 for better overview.

The signs for each group of signs are XORed by first XOR elements 1413-1416. The outputs of the first XOR elements 1413-1416 are further paired up and XORed by second XOR elements 1417, 1418. The outputs of the second XOR elements 1417, 1418 are XORed by a third XOR element 1419 which generates as its output a global sign.

Each 8-input module 1403 includes as last stage a 4-input module 1402 and thus (cf. FIG. 13) outputs two values. For each 8-input module 1403 the two values output by the 8-input module 1403 are scaled by a same constant by scaling modules 1405 which generates respective scaled pairs of output values 1406-1409.

Similar to the sign operation, these pairs of output values 1406-1409 are further paired up to be used as input to two 4-input modules 1431 which output pairs of values 1410, 1411 which are again fed to an 4-input module 1432 which generates a final pair of output values 1412.

All these local/global amplitudes/signs, i.e. the pairs of values 1406 to 1412 and the signs output by the XOR elements are input to a selection module 1420.

The selection module 1420 may be part of the Rcv update module 1400 but is shown separately in FIG. 14 for better overview.

The operation of the selection module 1420 may be controlled by the coding rate.

The selection module 1420 generates four groups of desired signs and amplitudes 1421 to 1424 according to the specified coding rate, i.e., in this example, ½, ¾, or ⅞.

Each group 1421 to 1424 is a group comprising a minimum, a second minimum, a sign and an index of the minimum.

Each group 1421 to 1424 controls one group 1425 of four groups of multiplexers to get the rightful amplitude for each group. Each group of multiplexers is part of an output stage module 1433 which are shown separately in FIG. 14 for a better overview.

In each output stage module 1433 the amplitudes are combined with the signs by combiners 1426 to get the updated Rcv values which form the 32 outputs of the Rcv update module 1400.

With the careful design of the parity check matrices, embodiments such as the one illustrated in FIG. 7 can support multiple LDPC codes with same length and different rates. In one embodiment, to support this, these parity check matrices are derived from one 'mother' code. In one embodiment, as 'mother' code, the code corresponding to the third parity check matrix 403 is used. It has 4 layers with a coding rate $R=⅞$.

From this code the rate ¾ code given by the second parity check matrix 402 and the ½ rate code given by the first parity check matrix 401 may be constructed in a way that the 4-cycle cyclic property is maintained.

This can be done through column-wise expansions of the 'mother' parity check matrix, i.e. the third parity check matrix 403. For example, consider, the second parity check matrix 402. Two block-rows of the second parity check matrix 402 may be generated by expansion of one block-row of the third parity check matrix 403. It may be said that the code corresponding to the second parity check matrix 402 has an expansion factor of 2.

The 4-cycle cyclic property may be maintained for the two-block-row groups, as it is illustrated by entries 408-411 of the second parity check matrix 402 in FIG. 4. These expanded two block-rows can be processed simultaneously since there is only one edge to be updated for these two block-rows and thus no conflict exists. The first parity check matrix 401 has an expansion factor of 4 and can be decoded in a similar way with four-block-row groups processed simultaneously and only 4 cycles are needed for one iteration.

The embodiment described above with reference to FIG. 7 supports all these codes without a change of the interconnection networks. The exemplary Rcv control module 1420 shown in FIG. 14 is able to control the Rcv update according to the specified coding rate with some simple control logic and multiplexers. Although the embodiment illustrated in FIG. 8 can support the code with the maximum expansion factor of 4, the architecture can be applied to any set of code with any expansion factors.

The embodiment described above with reference to FIG. 8 illustrates a fully parallel implementation of the LDPC decoder shown in FIG. 7. However, it should be noted that embodiments can also be configured as semi-parallel implementation as well. For example, the number of CNPs 704 (in FIG. 7) may be reduced to one third for low-complexity applications by time-sharing the CNPs. To support the resource sharing, the direct interconnections 701 and 702 shown in FIG. 7 may for example be modified by inserting a bank of multiplexers. This is illustrated in FIG. 15.

Figure 15:
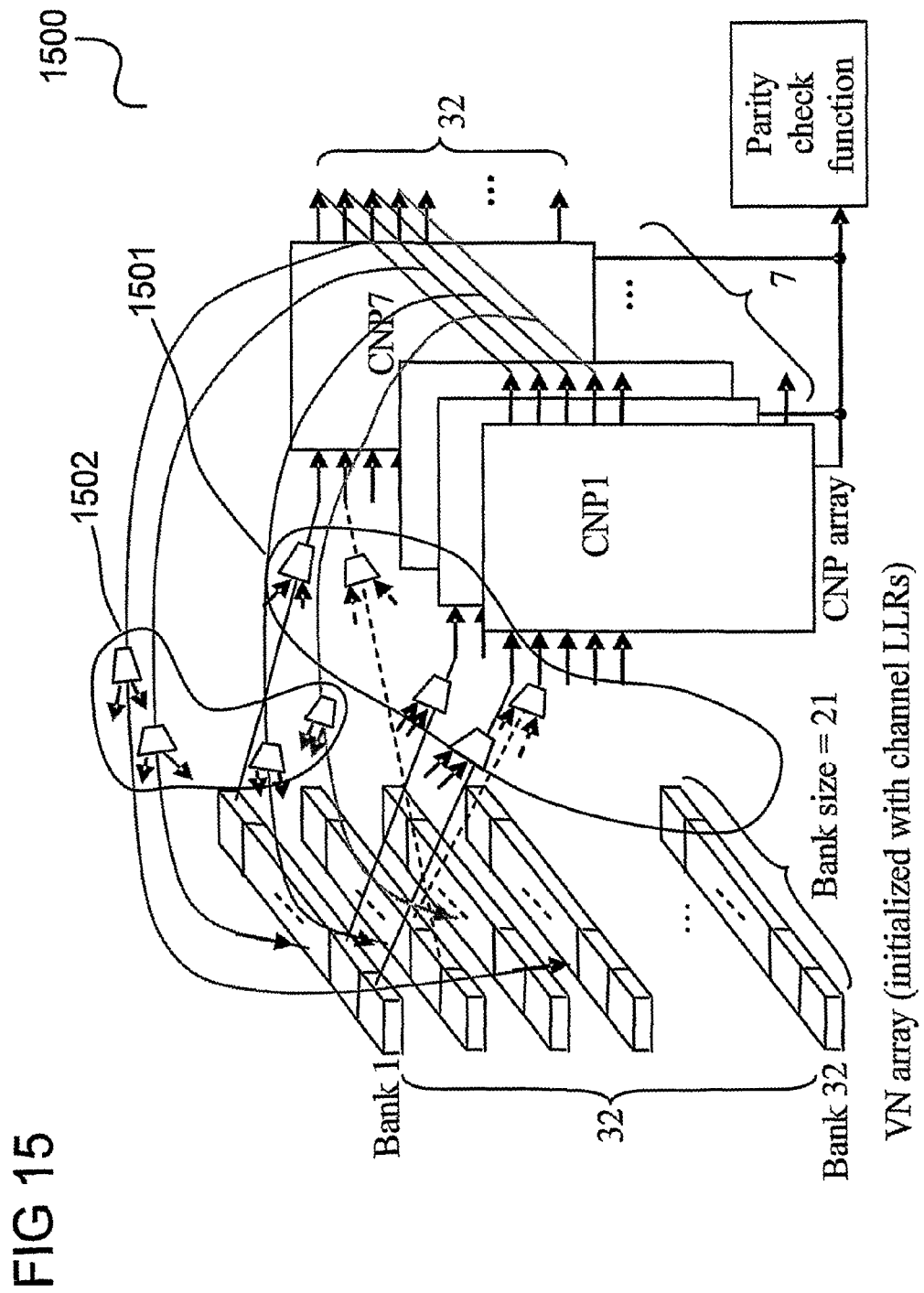
FIG. 15 shows a decoder according to an embodiment.

FIG. 15 shows a decoder 1500 according to an embodiment.

The architecture of the decoder 1500 is similar to the architecture of the decoder 800 and the decoder 1500 has similar components as the decoder 800 described with reference to FIG. 8.

A difference is that only ⅓ of check node processors are instantiated in the decoder 1500 (CNP1-CNP7 instead of CNP1-CNP21). For this, there are a bank of multiplexers 1501 in the VN-to-CNP network and a bank of de-multiplexers 1502 in the CNP-to-VN network, i.e. in the interconnections corresponding to the interconnections 701, 702 of the decoder shown in FIG. 7.

This allows a CNP to process different data symbols stored in the VN banks (at different times, i.e. at different processing time shares) by multiplexing the components stored in different storage elements of the VN banks to the same CNP (one component for a certain processing time share) and de-multiplexing the output to the correct storage element.

The LDPC decoder designed in this way has lower throughput but the silicon size is reduced.

Figure 16:
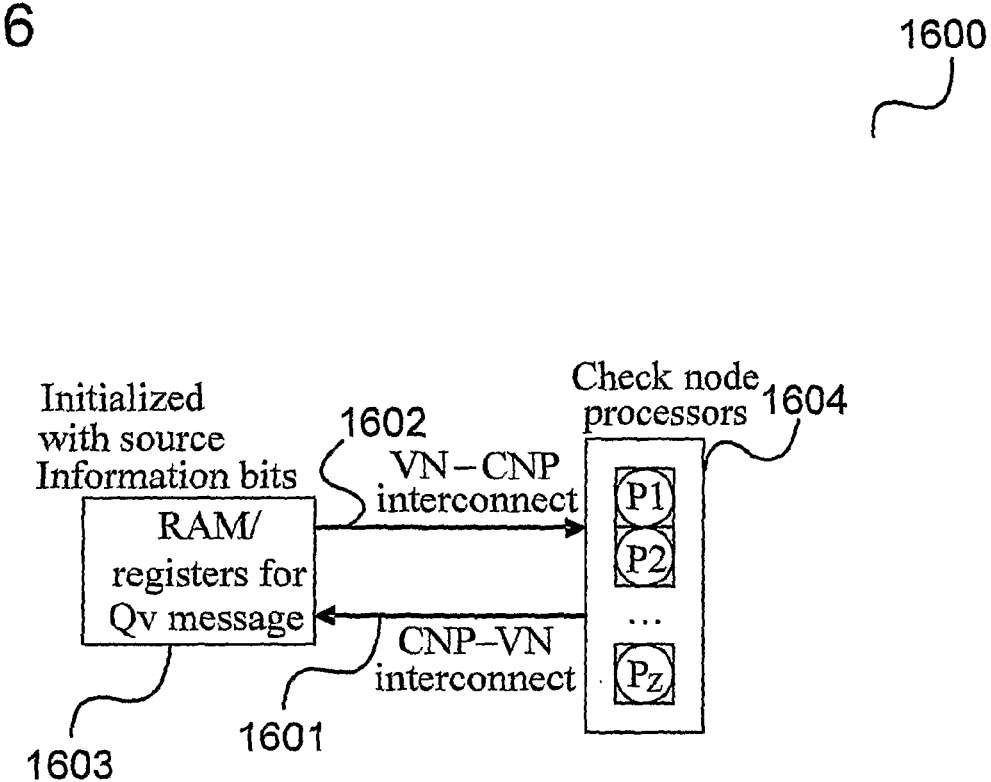
FIG. 16 shows an encoder according to an embodiment.

According to one embodiment, a LDPC encoder architecture is used as illustrated in FIG. 16.

FIG. 16 shows an encoder 1600 according to an embodiment.

Compared with the architecture of the decoder 700 illustrated in FIG. 7, the encoder 1600 includes components 1601-1604 that are similar to the components 701-704 of the decoder 700.

The encoder 1600 differs from the decoder 700 in that the Rcv memory 705 and the parity check function 706 have been removed for the encoder 1600. Further, the encoder 1600 includes a memory 1603 which is one-bit in bit-width and is used to buffer the codeword, whereas the device 703 is to store the soft LLR values from the channel (i.e. generated for the received signal).

The encoder 1600 further includes a CNP array 1604 that is, according to an embodiment, less complicated as the exemplary implementation of the CNP array 704 as it is illustrated in FIG. 14.

In summary, according to one embodiment, the interconnections 1601 and 1602, the memory 1603 and the CNP array 1604 may be regarded as subsets of the components 701 to 704 of the decoder 700 shown in FIG. 7, respectively.

Figure 17:
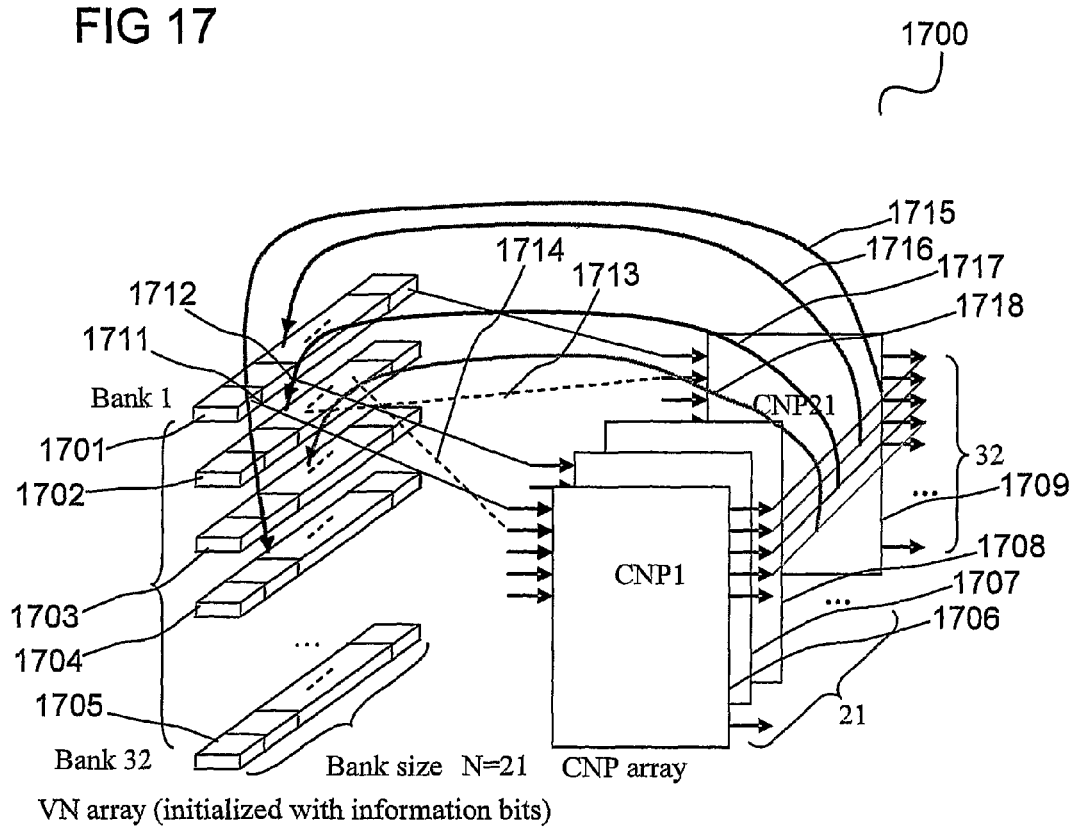
FIG. 17 shows an encoder according to an embodiment.

An exemplary LDPC encoder in accordance with an embodiment is shown in FIG. 17.

FIG. 17 shows an encoder 1700 according to an embodiment.

The architecture of the encoder 1700 is similar to the layered decoder 800 described above with reference to FIG. 8.

The encoder 1700 differs from the decoder 800 in that the Qv array (i.e. the VN banks) are initialized with information bits to be encoded, and all the messages (i.e. the symbols) exchanged by the interconnection lines 1711 to 1718 in the encoder 17 are of 1-bit bit width. Furthermore, in one embodiment, the CNPs 1706-1709 are implemented with less complexity (i.e. are simpler) than the CNPs 806-809 of the encoder 800.

Figure 18:
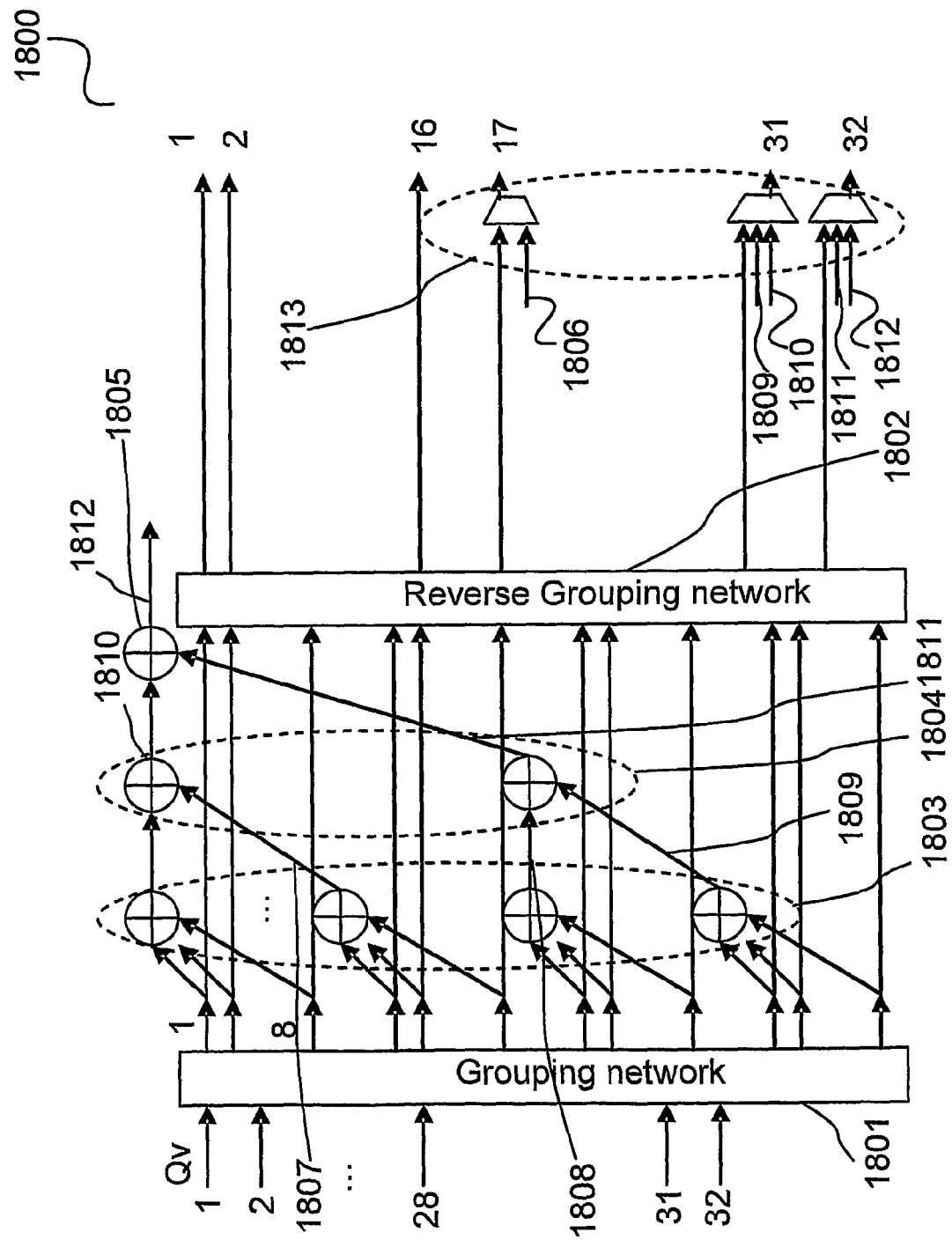
FIG. 18 shows a check node processor according to an embodiment.

FIG. 18 shows a check node processor 1800 according to an embodiment.

The CNP 1800 is an example for the CNPs 1706-1709 of the encoder 1700.

The CNP 1800 has components similar to the Rcv update module 1400, such as grouping/reverse grouping modules 1801 and 1802, and 3-level exclusive OR (XOR) modules 1803-1805.

Accordingly, values 1806-1812 are generated in course of the processing similar to values 1406-1412 of FIG. 14.

The only overhead of the CNP 1800 may be seen in multiplexers 1813 and associated control logic to select the correct parity check bit to the corresponding port (i.e. output).

The exemplary circuit shown in FIG. 18 for the check node processor 1800 is, according to one embodiment, able to support all code rates corresponding to the parity check matrices 401-403 shown in FIG. 4.

Figure 19:
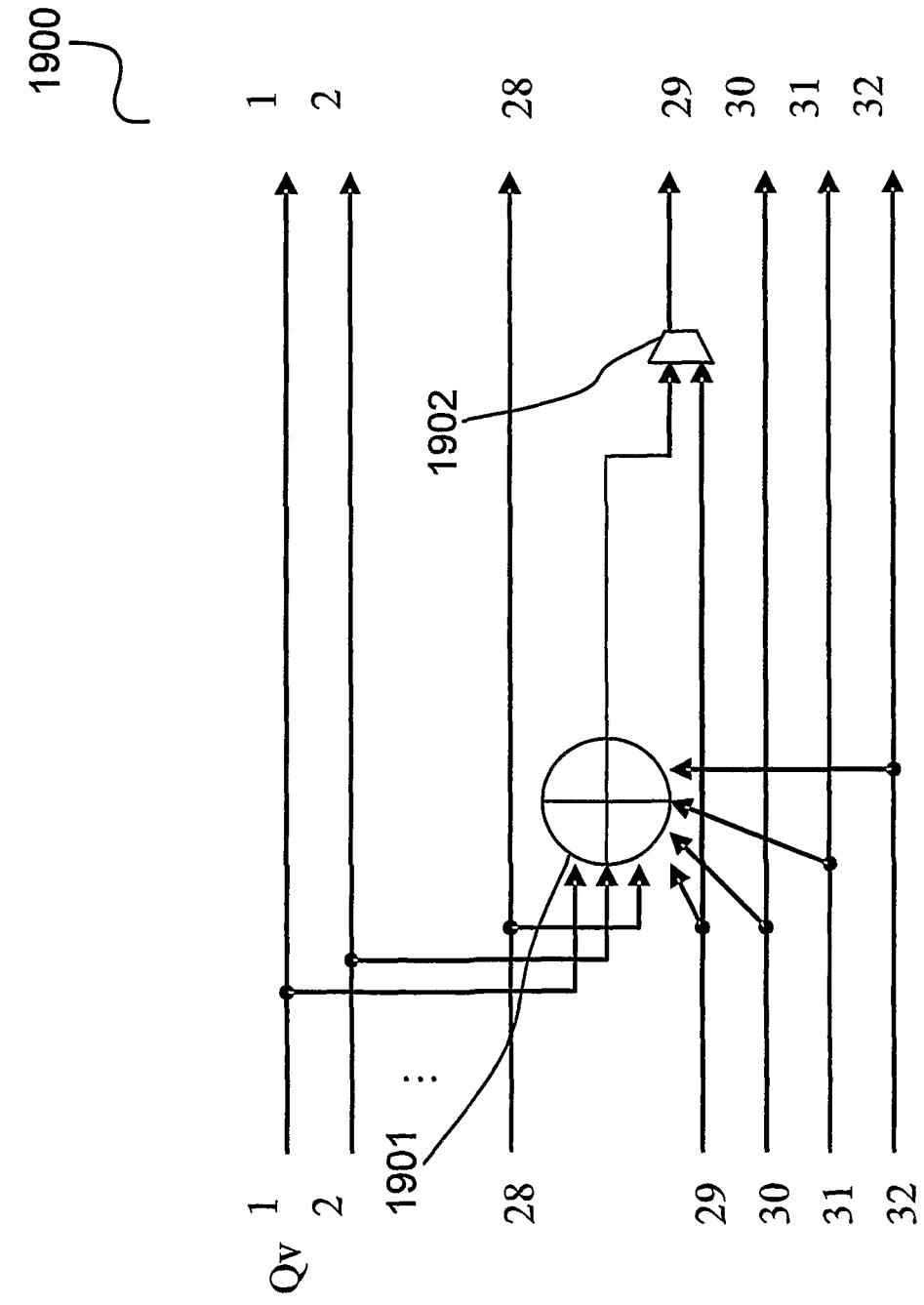
FIG. 19 shows a check node processor according to an embodiment.

An exemplary encoder CNP circuit with less complexity usable for the code corresponding to the third parity check matrix 403 is illustrated in FIG. 19.

FIG. 19 shows a check node processor 1900 according to an embodiment.

For this code the grouping/reverse grouping modules 1801, 1802 are not necessary since the one 'macro' layer is just one block-layer for this code.

The memory 1603 (Qv array) of the encoder 1600 is initialized with a 28-bit information bit word from the incoming information bit-stream. The parity check banks of the Qv array (i.e. the 29th bank to the 32th bank of the Qv which correspond to the parity bits) are (initially) filled with zeros.

A 32-input XOR gate 1901 calculates the parity check bits for different layers. The XORed bit is then output to the 29th output port (via multiplexer 1902). At the first encoding cycle the 29th parity check bit is generated and cyclically shifted to the 32th bank of the Qv array through the CNP-to-VN-network (which is configured as described above with for example reference to FIG. 11).

At the second encoding cycle the 30th parity bit is generated from all 28 inputs (i.e. information bits) plus the newly generated 29th parity check bit (at the input port 32) and output to the 29th output port again. In this manner four cycles are used to fill the four parity check banks for the code corresponding to the third parity check matrix 403 illustrated in FIG. 4.

The exemplary CNP circuitry illustrated in FIGS. 18 and 19 may for example be used for the architecture illustrated in FIG. 17.

This architecture is similar to the exemplary decoding architecture illustrated in FIG. 8. Therefore, this architecture is used, according to one embodiment, for both encoding and decoding for half-duplex applications where the encoding process can share the resources of the decoding process.

For full-duplex, simplex and broadcasting applications where the explicit instantiation of both LDPC encoder and decoder are compulsory, a slightly simpler encoder architecture is used according to one embodiment. This is illustrated in FIG. 20.

Figure 20:
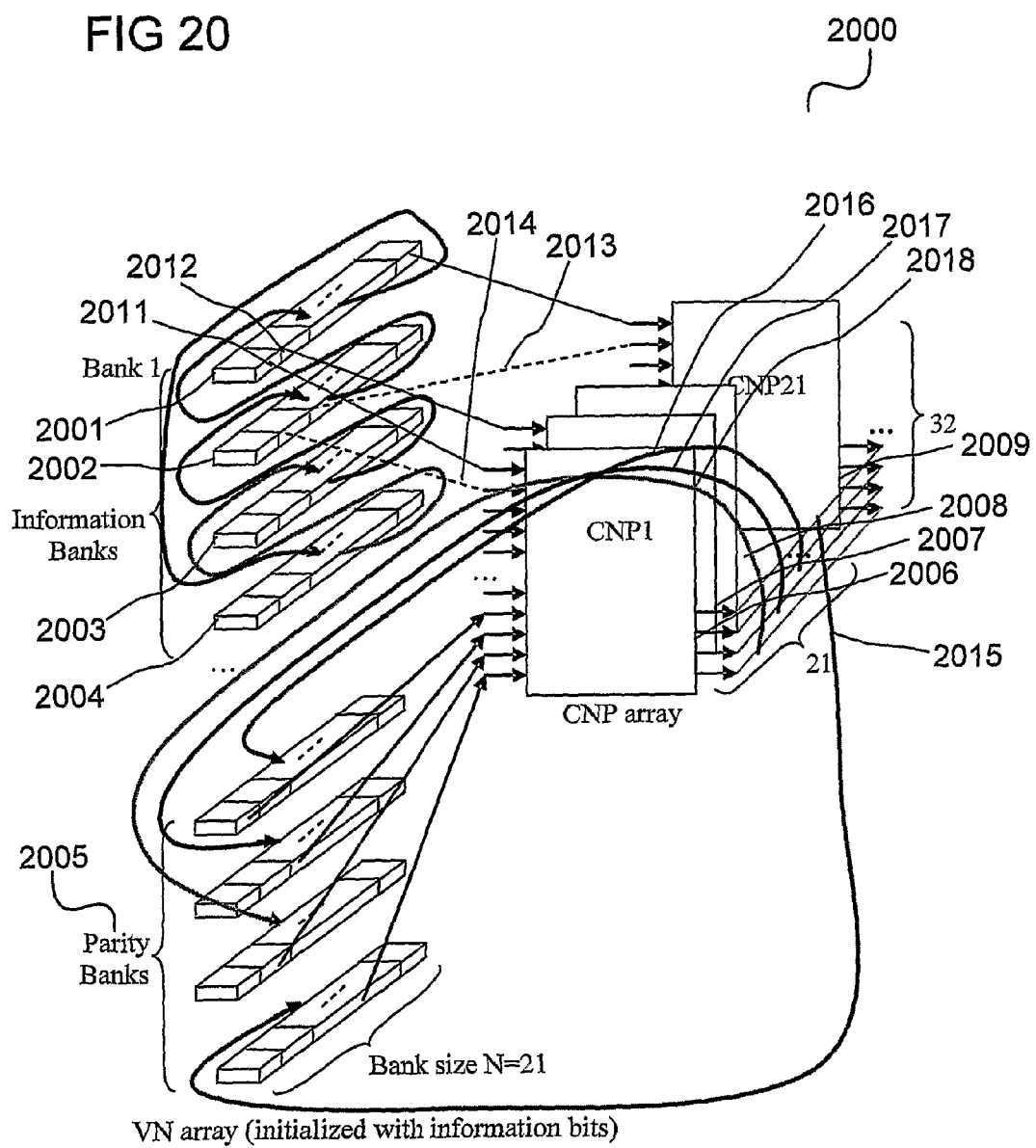
FIG. 20 shows an encoder according to an embodiment.

FIG. 20 shows an encoder 2000 according to an embodiment.

The encoder 2000 includes information bit banks 2001-2004, parity bit banks 2005, and a CNP array with 21 check node processors 2006-2009.

In this example, the information bit banks 2001-2004 are locally connected with each other, and the CNPs 2006-2009 only output parity check bits.

Similar to the decoder 800 shown in FIG. 8, the encoder 2000 includes first bank connections 2011 and 2012 and second bank connections 2013 and 2014.

A flattened view of the exemplary architecture of the encoder 2000 is given in FIG. 21.

FIG. 21 shows an encoder 2100 according to an embodiment.

The encoder 2100 corresponds to the encoder 2000 and includes information bit banks 2101, parity check bit banks 2102, and CNPs 2105.

The information bit banks 2101 are initialized with information bits to be encoded, the parity banks 2102 are initialized with all zeros. For the information bit banks 2101 (initialized with information bits), a local cyclic connection 2103 is used via which in each cycle, every information bit bank 2101 receives the value previously stored in one of the other information bit banks 2101. The values stored in the parity check banks 2002 are, in contrast, updated by the respective CNP output via CNP-to-VN connections 2104 (corresponding to CNP-to-VN connections 2015-2018 for the parity banks in FIG. 20). It should be noted that the VN-to-CNP connections and the CNP-to-VN connections of the encoder 2100 implement cyclic shifts as explained above with reference to FIG. 9. For example, the cyclic shifts for the VN-to-CNP connections and the CNP-to-VN connections for the parity bit banks 2102 are given by the last four block columns numbered 29 to 32 of the third parity check matrix 403.

Figure 22A:
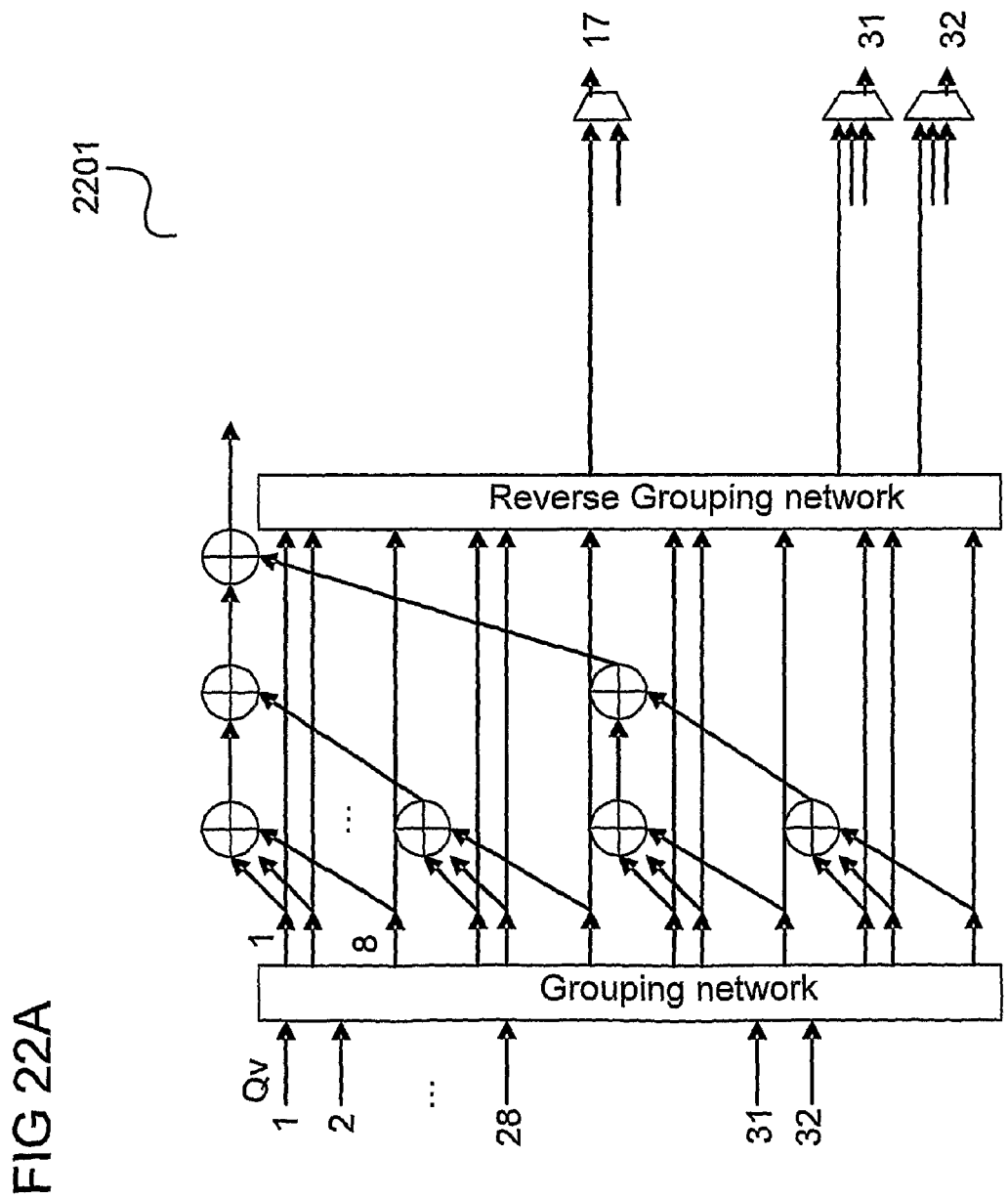
FIGS. 22a and 22b show CNPs according to an embodiment.
Figure 22B:
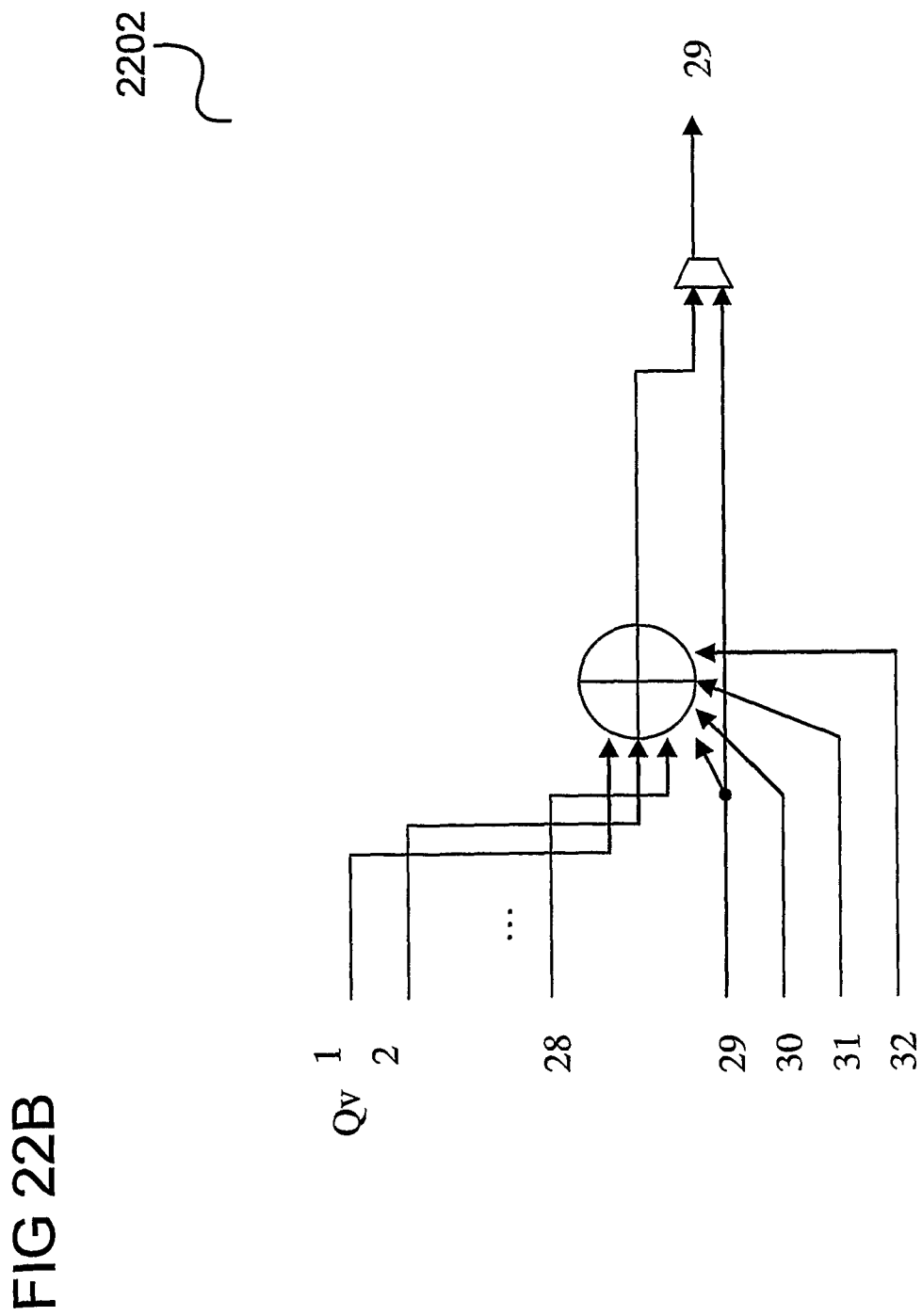

Examples for the architecture of the CNPs 2006-2009 are shown in FIGS. 22a and 22b.

FIGS. 22a and 22b show CNPs 2201, 2202 according to an embodiment.

CNP 2201 shown in FIG. 22a may be used for all codes corresponding to the parity check matrices 401-403, i.e. for all code rates.

CNP 2201 is similar to the CNP 1800 described above with reference to FIG. 8 without the outputs labelled 1 to 16.

CNP 2202 may be used the code corresponding to the third parity check matrix 403. It is similar to the CNP 1900 described above with reference to FIG. 19 but comprises only the 29th output.

Though the above examples are described with reference to the LDPC codes as defined in the IEEE 802.15.3c draft standard, embodiments can also be used for other codes than the LDPC encoding intended for IEEE 802.15.3c wireless networks. For example, the embodiment described with reference to FIG. 16 may also be used for the LDPC codes proposed to the emerging WiMedia standard as they are illustrated in FIG. 23.

Figure 23:
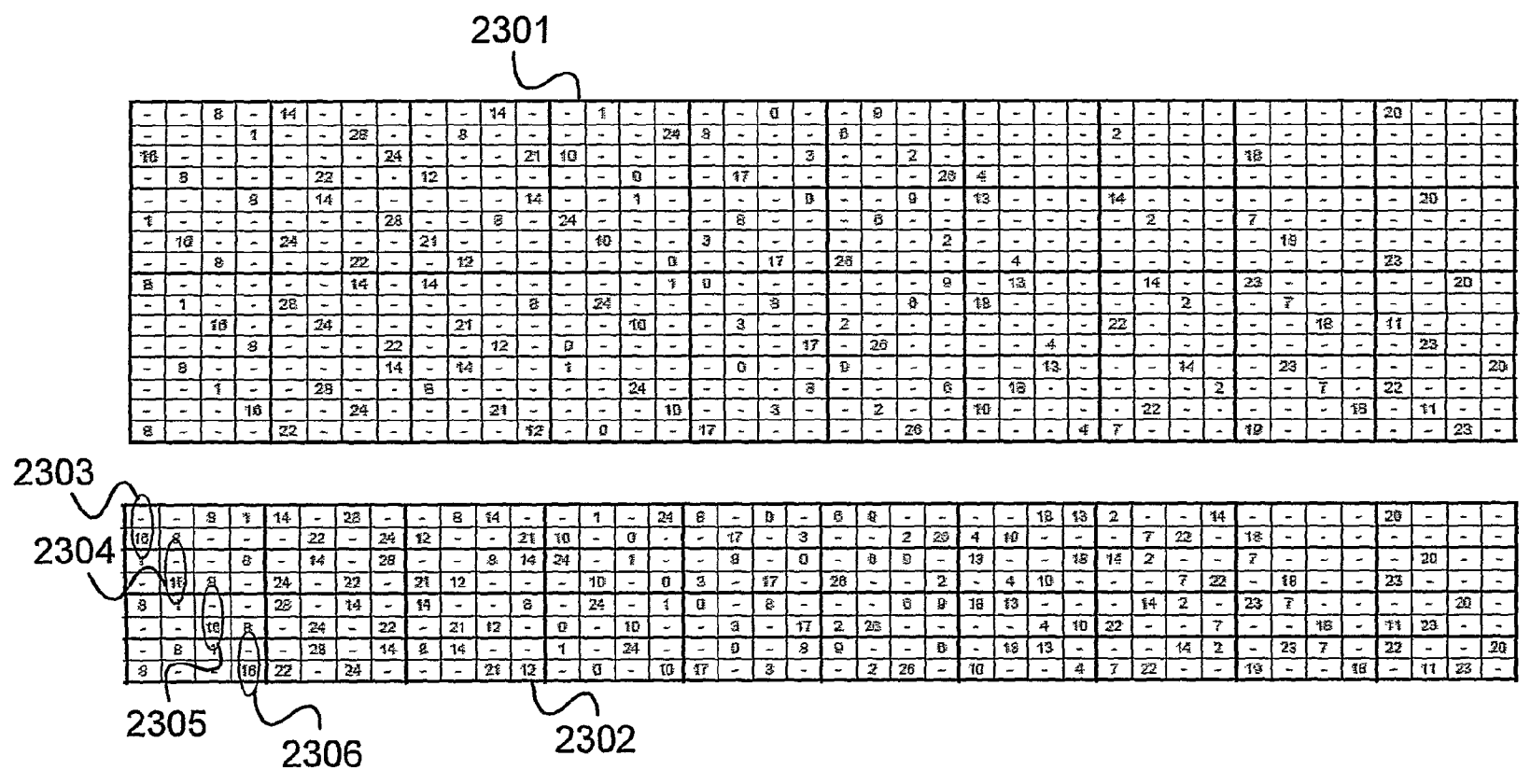

FIG. 23 shows parity check matrices 2301, 2302 according to an embodiment.

The code corresponding to the first parity check matrix 2301 is a rate 0.6 LDPC code, and the code corresponding to the second parity check matrix 2302 is a code with code rate 0.8. As one can see from the marked entries 2303-2306, the 4-cycle cyclic structure of the second parity check matrix 2302 is as in the parity check matrices 401-403 shown in FIG. 2.

To support these codes, the exemplary architectures illustrated in both FIG. 17 and FIG. 20 may be used. An exemplary circuitry for a CNP to be used for the code corresponding to the second parity check matrix 2302 is illustrated in FIG. 24.

Figure 24:
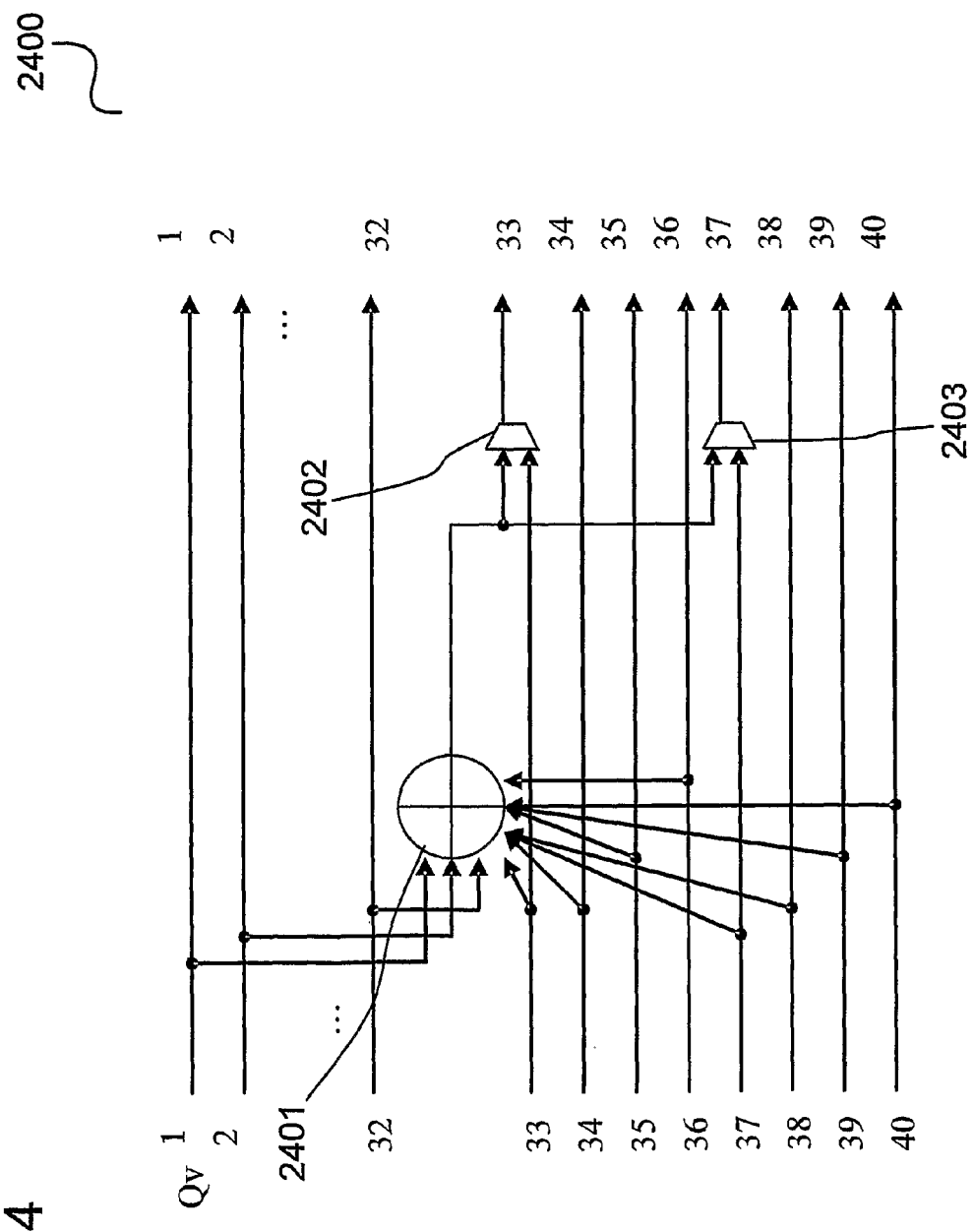
FIG. 24 shows a check node processor according to an embodiment.

FIG. 24 shows a check node processor 2400 according to an embodiment.

Compared with the CNP 1900 for the code corresponding to the third parity check matrix 403, the XOR gate 2401 is changed to a 40-input XOR gate and there is, in addition to the multiplexer 2402, an additional multiplexer 2403 added at the output port. This is because there is a similar block-wise triangularity for the parity check portion of the parity check matrices. Similar circuitry can be used for the code corresponding to the first parity check matrix 2301 in FIG. 23 as well.

With one embodiment, e.g. an LDPC codec implementation with only hardwired interconnections, has the following effects:

It saves the resource for parity check matrix storage and the complicated control logic for routing networks.

It is able to finish one iteration in just a few cycles which is independent of the H row weight, thus suitable for high throughput/low latency applications. Meanwhile the fast convergence/performance is guaranteed since layered decoding is employed.

Only fixed hard-wired interconnects are used, for multiple LDPC codes derived from one 'mother' code. This eliminate the needs for ROM for storing H matrix, and greatly reduce the interconnect routing congestions in IC design/place and route. The decoding latencies for all these codes are same.

It provides flexible trade-off between hardware complexity and processing latency.

The encoder can make fully use of decoder resources with trivial hardware overhead.

Both encoder and decoder have very low latency.

Figure 25:
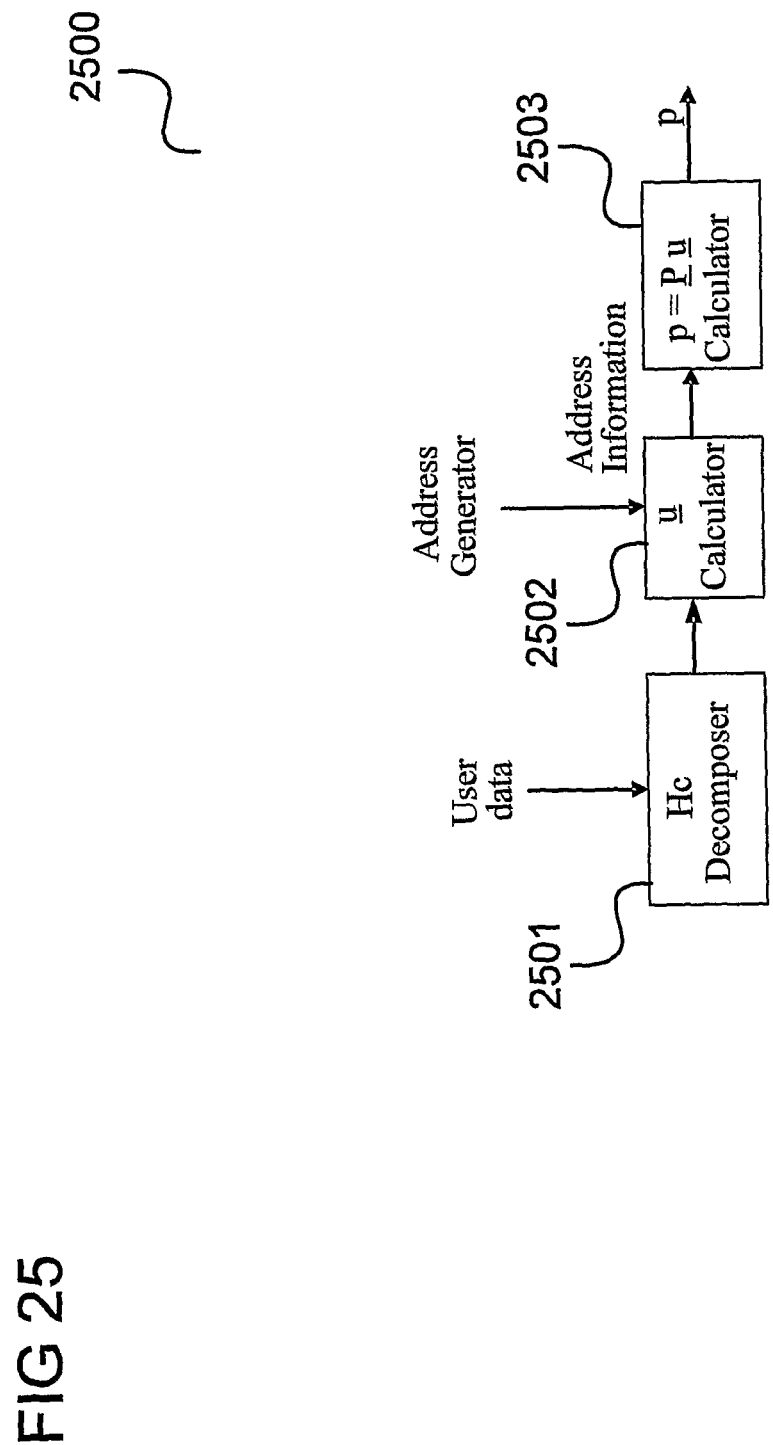
FIG. 25 shows a conventional LDPC encoder architecture.

For comparison, a conventional LDPC encoder 2500 is illustrated in FIG. 25. It comprises a Hc decomposer 2501, an u calculator 2502, and a p calculator 2503. To calculate u, one has to store the parity check matrix and use complicated address/control logic. Most importantly, in conventional LDPC encoders, there are no concerns of decoding architecture at all. In contrast, the LDPC encoder according to an embodiment fully makes use of the resource of the LDPC decoder and requires negligible overhead.

The invention claimed is:

1. A decoding circuit comprising a data buffer, comprising a plurality of storage elements for storing data symbols; a processing circuit comprising a plurality of inputs and a plurality of outputs, wherein the processing circuit is configured to process data symbols received via the plurality of inputs and output the processed data symbols via the plurality of outputs; wherein each storage element of the plurality of storage elements is coupled to an associated input of the plurality of inputs, wherein the association of the plurality of storage elements with the plurality of inputs is determined by a first decoding parameter; wherein each storage element of the plurality of storage elements is coupled to an associated output of the plurality of outputs, wherein the association of the plurality of storage elements with the plurality of outputs is determined by a second decoding parameter; wherein the first decoding parameter and the second decoding parameter are determined by a decoding rule and wherein the first decoding parameter and the second decoding parameter are not changed throughout the decoding process; and wherein the first decoding parameter and the second decoding parameter each specify a shift of a block of data symbols with respect to the plurality of inputs and the plurality of outputs.

2. The decoding circuit according to claim 1, wherein the first decoding parameter and the second decoding parameter are non-negative integers.

3. The decoding circuit according to claim 1, wherein the decoding rule is given by an error correction code.

4. The decoding circuit according to claim 3, wherein the error correction code is a parity check code.

5. The decoding circuit according to claim 4, wherein the error correction code is a low density parity check code.

6. The decoding circuit according to claim 1, wherein the data symbols correspond to transmission symbols received via a communication channel.

7. The decoding circuit according to claim 6, wherein the data symbols are Log-Likelihood Ratios for the transmission symbols.

8. The decoding circuit according to claim 1, wherein the processing circuit is configured to check based on the data symbols whether a pre-determined criterion is fulfilled.

9. The decoding circuit according to claim 8, wherein the pre-determined criterion is based on a parity checking of the data symbols.

10. The decoding circuit according to claim 1, wherein each storage element is configured to output its stored data symbol to its associated input.

11. The decoding circuit according to claim 10, wherein each storage element is configured to, after outputting its stored data symbol to its associated input, receive another data symbol from its associated output, store the other data symbol and output the other data symbol to its associated input.

12. The decoding circuit according to claim 1, wherein the coupling of each storage element to its associated input is hard-wired.

13. The decoding circuit according to claim 1, wherein the coupling of each storage element to its associated output is hard-wired.

14. The decoding circuit according to claim 1, being a circuit for both encoding and decoding.

15. An encoding circuit comprising a data buffer, comprising a plurality of storage elements for storing data symbols; a processing circuit comprising a plurality of inputs and a plurality of outputs, wherein the processing circuit is configured to process data symbols received via the plurality of inputs and output the processed data symbols via the plurality of outputs; wherein each storage element of the plurality of storage elements is coupled to an associated input of the plurality of inputs, wherein the association of the plurality of storage elements with the plurality of inputs is determined by a first encoding parameter; wherein each storage element of the plurality of storage elements is coupled to an associated output of the plurality of outputs, wherein the association of the plurality of storage elements with the plurality of outputs is determined by a second encoding parameter wherein the first encoding parameter and the second encoding parameter are determined by a encoding rule wherein the first encoding parameter and the second encoding parameter are not changed throughout the encoding process; and wherein the first decoding parameter and the second decoding parameter each specify a shift of a block of data symbols with respect to the plurality of inputs and the plurality of outputs.

16. A communication system comprising a receiver with a decoding circuit and a transmitter with an encoding circuit, the decoding circuit comprising: a data buffer, comprising a plurality of storage elements for storing data symbols; a processing circuit comprising a plurality of inputs and a plurality of outputs, wherein the processing circuit is configured to process data symbols received via the plurality of inputs and output the processed data symbols via the plurality of outputs; wherein each storage element of the plurality of storage elements is coupled to an associated input of the plurality of inputs, wherein the association of the plurality of storage elements with the plurality of inputs is determined by a first decoding parameter; wherein each storage element of the plurality of storage elements is coupled to an associated output of the plurality of outputs, wherein the association of the plurality of storage elements with the plurality of outputs is determined by a second decoding parameter; wherein the first decoding parameter and the second decoding parameter are determined by a decoding rule and wherein the first decoding parameter and the second decoding parameter are not changed throughout the decoding process; the encoding circuit comprising: a data buffer, comprising a plurality of storage elements for storing data symbols; a processing circuit comprising a plurality of inputs and a plurality of outputs, wherein the processing circuit is configured to process data symbols received via the plurality of inputs and output the processed data symbols via the plurality of outputs; wherein each storage element of the plurality of storage elements is coupled to an associated input of the plurality of inputs, wherein the association of the plurality of storage elements with the plurality of inputs is determined by a first encoding parameter; wherein each storage element of the plurality of storage elements is coupled to an associated output of the plurality of outputs, wherein the association of the plurality of storage elements with the plurality of outputs is determined by a second encoding parameter wherein the first encoding parameter and the second encoding parameter are determined by a encoding rule wherein the first encoding parameter and the second encoding parameter are not changed throughout the encoding process; and wherein the first decoding parameter and the second decoding parameter each specify a shift of a block of data symbols with respect to the plurality of inputs and the plurality of outputs.

17. A method for decoding comprising coupling each storage element of a plurality of storage elements for storing data symbols to an associated input of a plurality of inputs of a processing circuit being configured to process data symbols received via the plurality of inputs and output the processed data symbols via a plurality of outputs, wherein the association of the plurality of storage elements with the plurality of inputs is determined by a first decoding parameter; coupling each storage element of the plurality of storage elements to an associated output of the plurality of outputs, wherein the association of the plurality of storage elements with the plurality of outputs is determined by a second decoding parameter; wherein the first decoding parameter and the second decoding parameter are determined by a decoding rule and wherein the first decoding parameter and the second decoding parameter are not changed throughout the decoding process; and wherein the first decoding parameter and the second decoding parameter each specify a shift of a block of data symbols with respect to the plurality of inputs and the plurality of outputs.

18. A method for encoding comprising coupling each storage element of a plurality of storage elements for storing data symbols to an associated input of a plurality of inputs of a processing circuit being configured to process data symbols received via the plurality of inputs and output the processed data symbols via a plurality of outputs, wherein the association of the plurality of storage elements with the plurality of inputs is determined by a first encoding parameter; coupling each storage element of the plurality of storage elements to an associated output of the plurality of outputs, wherein the association of the plurality of storage elements with the plurality of outputs is determined by a second encoding parameter; wherein the first encoding parameter and the second encoding parameter are determined by a encoding rule and wherein the first encoding parameter and the second encoding parameter are not changed throughout the decoding process; and wherein the first decoding parameter and the second decoding parameter each specify a shift of a block of data symbols with respect to the plurality of inputs and the plurality of outputs.

* * * * *